(12) United States Patent
Lee

(10) Patent No.: US 11,777,459 B2
(45) Date of Patent: *Oct. 3, 2023

(54) ACTIVE DUPLEXER

(71) Applicant: Skyworks Solutions, Inc., Irvine, CA (US)

(72) Inventor: Hanseung Lee, Newbury Park, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/652,445

(22) Filed: Feb. 24, 2022

(65) Prior Publication Data

US 2022/0416738 A1 Dec. 29, 2022

Related U.S. Application Data

(63) Continuation of application No. 16/951,707, filed on Nov. 18, 2020, now Pat. No. 11,296,664.

(Continued)

(51) Int. Cl.
*H04B 1/38* (2015.01)
*H04L 5/16* (2006.01)
(Continued)

(52) U.S. Cl.
CPC ............... *H03F 3/245* (2013.01); *H03F 1/56* (2013.01); *H03F 3/195* (2013.01); *H04B 1/50* (2013.01);
(Continued)

(58) Field of Classification Search
CPC . H03F 3/245; H03F 3/195; H03F 1/56; H03F 2200/423; H03F 2200/451;
(Continued)

(56) References Cited

U.S. PATENT DOCUMENTS 7,825,745 B1 11/2010 Gavin et al.
8,374,561 B1 2/2013 Yung et al.
(Continued)

OTHER PUBLICATIONS

Lee, et al., "Active Diplexer Based on Isolation Circuits Imbedded Low Noise Amplifiers (LNA)," Proceedings of the 45th European Microwave Conference, Sep. 2015.
(Continued)

*Primary Examiner* — Phuong Phu
(74) *Attorney, Agent, or Firm* — Knobbe, Martens, Olson & Bear, LLP

(57) ABSTRACT

A front-end module of a wireless device can replace a passive duplexer with an active duplexer that uses metamaterial matching circuits. The active duplexer can be formed from a power amplifier circuit and a low noise amplifier circuit that each include a metamaterial matching circuit. The combination of a power amplifier circuit and a low noise amplifier circuit that each utilize metamaterials to form the associated matching circuit can provide the functionality of a duplexer without including the additional circuitry of a stand-alone or passive duplexer. Thus, in certain cases, the front-end module can provide duplexer functionality without including a separate duplexer. Advantageously, in certain cases, the size of the front-end module can be reduced by eliminating the passive duplexer. Further, the loss introduced into the signal path by the passive duplexer is eliminated improving the performance of the communication system that includes the active duplexer.

20 Claims, 24 Drawing Sheets

Related U.S. Application Data

(60) Provisional application No. 62/939,486, filed on Nov. 22, 2019.

(51) Int. Cl.
*H03F 3/24* (2006.01)
*H03F 3/195* (2006.01)
*H03F 1/56* (2006.01)
*H04B 1/50* (2006.01)

(52) U.S. Cl.
CPC .. *H03F 2200/294* (2013.01); *H03F 2200/318* (2013.01); *H03F 2200/387* (2013.01); *H03F 2200/423* (2013.01); *H03F 2200/451* (2013.01)

(58) Field of Classification Search
CPC ......... H03F 2200/318; H03F 2200/294; H03F 2200/387; H04B 1/50; H04B 1/0053
USPC ...................................... 375/229, 219, 222
See application file for complete search history.

(56) References Cited

U.S. PATENT DOCUMENTS

| | | | |
|---|---|---|---|
| 9,929,768 B2 | 3/2018 | Li et al. | |
| 10,374,558 B1 * | 8/2019 | Kuo | H03F 3/195 |
| 10,897,231 B2 | 1/2021 | Namie | |
| 11,296,664 B2 * | 4/2022 | Lee | H04B 1/0053 |
| 2009/0295483 A1 | 12/2009 | Alidio et al. | |
| 2010/0052814 A1 | 3/2010 | Plaze et al. | |
| 2010/0207703 A1 | 8/2010 | Dupuy et al. | |
| 2011/0210787 A1 | 9/2011 | Lee et al. | |
| 2012/0293249 A1 | 11/2012 | Lee | |
| 2013/0109434 A1 | 5/2013 | Dupuy et al. | |
| 2015/0070058 A1 | 3/2015 | Rada et al. | |
| 2017/0141909 A1 | 5/2017 | Yu et al. | |
| 2021/0159865 A1 | 5/2021 | Lee | |

OTHER PUBLICATIONS

Caloz, "Dual Composite Right/Left-Handed (D-CRLH) Transmission Line Metamaterial," IEEE Microwave and Wireless Components Letters, vol. 16, No. 11, Nov. 2006.

Lee, et al., "Triband Branch Line Coupler Using Double-Lorentz Transmission Lines," Microwave and Optical Technology Letters, vol. 50, No. 5, May 2008.

Lee, et al., "Dual Band Isolation Circuits Based on CRLH Transmission Lines for Triplexer Application," Proceedings of the Asia-Pacific Microwave Conference, 2011.

Lee, et al., "Study and analysis of contiguous channel triplexer based on combining method of two filtering circuits using CRLH and RH isolation circuits," International Journal of Microwave and Wireless Technologies, pp. 287-295, Mar. 4, 2014.

Krzysziofik, et al., "Metamaterials in Application to Improve Antenna Parameters," http://dx.doi.org/10.5772/intechopen.80636, 2018.

U.S. Appl. No. 16/951,707 Published as 2021/0159864 A1, filed Nov. 18, 2020, Active Duplexer.

U.S. Appl. No. 16/951,737 Published as 2021/0159865 A1, filed Nov. 18, 2020, Metamaterial Based Power Amplifier Module.

* cited by examiner

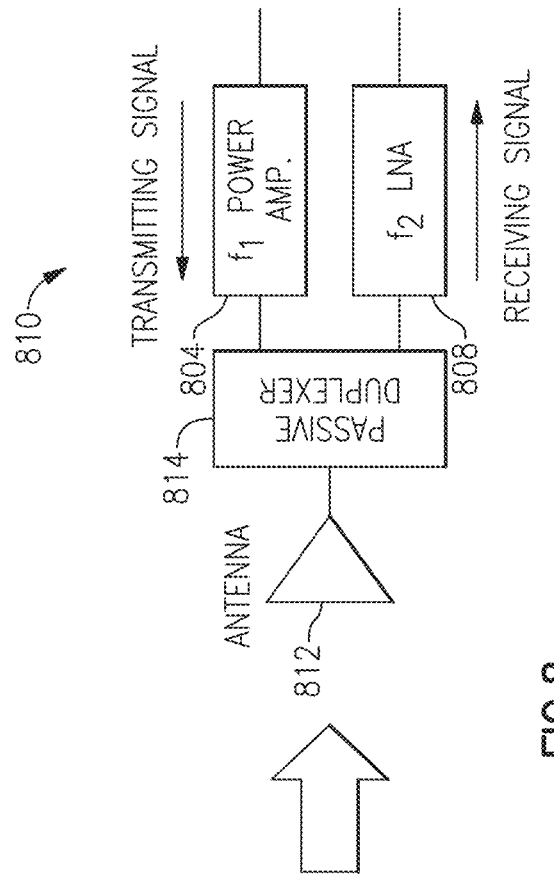
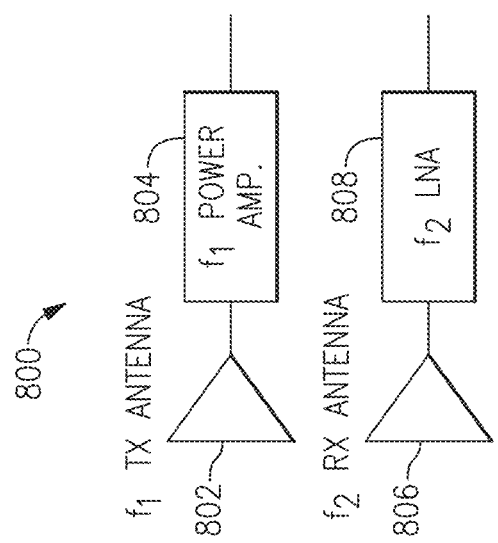
FIG.8

ACTIVE DUPLEXER

INCORPORATION BY REFERENCE TO ANY PRIORITY APPLICATIONS

This application is a continuation of U.S. application Ser. No. 16/951,707, which was filed on Nov. 18, 2020 and it titled "ACTIVE DUPLEXER," the disclosure of which is expressly incorporated by reference herein in its entirety for all purposes, and which claims priority to U.S. Provisional Application No. 62/939,486, which was filed on Nov. 22, 2019 and is titled "ACTIVE DUPLEXER," the disclosure of which is expressly incorporated by reference herein in its entirety for all purposes. Further, U.S. application Ser. No. 16/951,707 was filed on the same date as U.S. application Ser. No. 16/951,737, which is titled "METAMATERIAL BASED POWER AMPLIFIER MODULE" and is hereby expressly incorporated by reference herein in its entirety for all purposes. Any and all applications for which a foreign or domestic priority claim is identified in the Application Data Sheet as filed with the present application are hereby incorporated by reference under 37 CFR 1.57.

BACKGROUND

Technical Field

Embodiments of this disclosure relate to duplexers.

Description of the Related Art

Duplexers are typically three-port devices that enable the sharing of a single antenna. A transmitter may provide a signal to the duplexer, which may then output the signal to the antenna for transmission. Similarly, a signal received by the antenna may be provided to the duplexer, which may then output the signal to a receiver for further processing. The duplexer may isolate the transmitter from the receiver and vice versa enabling the sharing of the antenna and preventing a path from existing between the transmitter and the receiver.

SUMMARY

The systems, methods and devices of this disclosure each have several innovative aspects, no single one of which is solely responsible for the all of the desirable attributes disclosed herein. Details of one or more implementations of the subject matter described in this specification are set forth in the accompanying drawings and the description below.

Certain aspects of the present disclosure relate to an active duplexer. The active duplexer may include a power amplifier circuit configured to amplify a first signal of a first frequency to obtain a first amplified signal and to provide the first amplified signal to an antenna. The power amplifier circuit may include a metamaterial output matching circuit. Further, the active duplexer may include a low noise amplifier circuit configured to amplify a second signal of a second frequency received from the antenna to obtain a second amplified signal and to provide the second amplified signal to a subsequent circuit element. The low noise amplifier circuit may include a metamaterial input matching circuit. Further, the power amplifier circuit and the low noise amplifier circuit may form a duplexer without the inclusion of a passive duplexer circuit.

In some implementations, the subsequent circuit is a transceiver. Further, an impedance between the metamaterial output matching circuit and the antenna is at a first impedance value when signals of the first frequency are received by the power amplifier circuit and at a second impedance value when signals of the second frequency are received by the power amplifier circuit. Moreover, the first impedance value may permit processing of the signals of the first frequency by the power amplifier circuit and the second impedance value may block processing of the signals of the second frequency by the power amplifier circuit. In certain cases, an impedance between the metamaterial input matching circuit and the antenna is at the second impedance value when signals of the first frequency are received by the low noise amplifier circuit and at the first impedance value when signals of the second frequency are received by the low noise amplifier circuit. Further, the first impedance value may permit processing of the signals of the second frequency by the low noise amplifier circuit and the second impedance value may block processing of the signals of the first frequency by the low noise amplifier circuit.

In some cases, the first frequency is within a first frequency band the power amplifier circuit is configured to amplify and the second frequency is within a second frequency band the low noise amplifier circuit is configured to amplify. The power amplifier circuit may further include a non-metamaterial input matching circuit. The low noise amplifier circuit may further include a non-metamaterial output matching circuit. The metamaterial output matching circuit or the metamaterial input matching circuit can include a material with periodic structure. Moreover, the metamaterial output matching circuit or the metamaterial input matching circuit can include a lumped element circuit. In addition, the metamaterial output matching circuit or the metamaterial input matching circuit can include a metamaterial transmission line. The metamaterial output matching circuit or the metamaterial input matching circuit can include a dual-band single stub matching circuit.

Yet other aspects of the present disclosure relate to a front-end module. The front-end module may include an active duplexer that can include a power amplifier circuit and a low noise amplifier circuit. The power amplifier circuit may be configured to amplify a first signal of a first frequency to obtain a first amplified signal and to provide the first amplified signal to an antenna. The power amplifier circuit may include a metamaterial output matching circuit. The low noise amplifier circuit may be configured to amplify a second signal of a second frequency received from the antenna to obtain a second amplified signal and to provide the second amplified signal to a subsequent circuit element. The low noise amplifier circuit may include a metamaterial input matching circuit. A combination of the power amplifier circuit and the low noise amplifier circuit may be configured to function as a duplexer without the inclusion of a passive duplexer circuit. Further, the front-end module may include a switching circuit configured to switch between the power amplifier circuit and the low noise amplifier circuit.

In some implementations, the subsequent circuit element is the switching circuit. Further, an impedance between the metamaterial output matching circuit and the antenna may be at a first impedance value when signals of the first frequency are received by the power amplifier circuit and at a second impedance value when signals of the second frequency are received by the power amplifier circuit. Moreover, an impedance between the metamaterial input matching circuit and the antenna may be at the second impedance value when signals of the first frequency are received by the low noise amplifier circuit and at the first impedance value when signals of the second frequency are received by the low noise amplifier circuit. The first impedance value may permit processing of the signals of the first frequency at the power amplifier circuit and signals of the second frequency at the low noise amplifier circuit, and the second impedance value may prevent processing of the signals of the second frequency at the power amplifier circuit and signals of the first frequency at the low noise amplifier circuit. In some cases, the power amplifier circuit further includes a non-metamaterial input matching circuit and the low noise amplifier circuit further includes a non-metamaterial output matching circuit.

Further aspects of the present disclosure relate to a wireless device. The wireless device may include an antenna and an active duplexer. The antenna may be configured to receive or transmit signals of different frequencies. The active duplexer may include a power amplifier circuit and a low noise amplifier circuit. The power amplifier circuit may be configured to amplify a first signal of a first frequency to obtain a first amplified signal and to provide the first amplified signal to the antenna. The power amplifier circuit may include a metamaterial output matching circuit. Further, the low noise amplifier circuit may be configured to amplify a second signal of a second frequency received from the antenna to obtain a second amplified signal and to provide the second amplified signal to a subsequent circuit element. The low noise amplifier circuit may include a metamaterial input matching circuit. A combination of the power amplifier circuit and the low noise amplifier circuit may be configured to function as a duplexer without the inclusion of a passive duplexer circuit.

Certain aspects of the present disclosure are directed to a power amplifier module. The power amplifier module may include one or more power amplifier transistors configured to amplify a first signal of a first frequency to obtain a first amplified signal. Further, the power amplifier module may include a metamaterial output matching circuit connected between the one or more power amplifier transistors and an antenna. The metamaterial output matching circuit may be configured to present a first impedance value to the antenna when receiving signals of the first frequency and to present a second impedance value to the antenna when receiving signals of a second frequency.

In some implementations, the metamaterial output matching circuit includes a metamaterial transmission line. Further, the metamaterial output matching circuit may include a first metamaterial transmission line connected between a transistor of the one or more power amplifier transistors and the antenna, and a second metamaterial transmission line connected to the first metamaterial transmission line as a stub. In some cases, the power amplifier module further includes a non-metamaterial input matching circuit. The non-metamaterial input matching circuit may include a first non-metamaterial transmission line connected between a transistor of the one or more power amplifier transistors and an input port, and a second non-metamaterial transmission line connected to the first non-metamaterial transmission line as a stub.

In some embodiments, the metamaterial output matching circuit includes a material with a periodic structure. Further, the metamaterial output matching circuit may include a lumped element circuit. The first impedance value may permit transmission of the first amplified signal to the antenna. Further, the second impedance value may prevent transmission of the signals of the second frequency to the antenna. Moreover, in some cases, the power amplifier module in combination with a low noise amplifier circuit that includes a metamaterial input matching circuit forms a duplexer. Further, the duplexer may be formed without the inclusion of a passive duplexer circuit.

Yet additional aspects of the present disclosure are directed to a front-end module. The front-end module may include a power amplifier module that can include a power amplifier transistor and a metamaterial output matching circuit connected between the power amplifier transistor and an antenna. The power amplifier transistor may be configured to amplify a first signal of a first frequency to obtain a first amplified signal. Further, the metamaterial output matching circuit may be configured to present a first impedance value to the antenna when receiving signals of the first frequency and to present a second impedance value to the antenna when receiving signals of a second frequency. The front-end module may further include a switching circuit configured to switch a signal path between the power amplifier module and a low noise amplifier circuit.

In certain implementations, the metamaterial output matching circuit includes a first metamaterial transmission line connected between the power amplifier transistor and the antenna, and a second metamaterial transmission line connected to the first metamaterial transmission line as a stub. Further, the power amplifier module may include a non-metamaterial input matching circuit. In some cases, the non-metamaterial input matching circuit may include a first non-metamaterial transmission line connected between the power amplifier transistor and an input port of the power amplifier module, and a second non-metamaterial transmission line connected to the first non-metamaterial transmission line as a stub. The metamaterial output matching circuit may include at least one of a material with a periodic structure or a lumped element circuit. Further, the first impedance value may permit transmission of the first amplified signal to the antenna and the second impedance value may prevent transmission of the signals of the second frequency to the antenna. Moreover, the front-end module may include a low noise amplifier circuit that can include a metamaterial input matching circuit. In some cases, a combination of the power amplifier module and the low noise amplifier circuit form a duplexer without the inclusion of separate duplexer circuitry.

Further aspects of the present disclosure relate to a wireless device. The wireless device may include an antenna and a power amplifier module. The antenna may be configured to receive or transmit signals of different frequencies. Further, the power amplifier module may include a power amplifier transistor and a metamaterial output matching circuit connected between the power amplifier transistor and the antenna. The power amplifier transistor may be configured to amplify a first signal of a first frequency to obtain a first amplified signal. Further, the metamaterial output matching circuit may be configured to present a first impedance value to the antenna when receiving signals of the first frequency and to present a second impedance value to the antenna when receiving signals of a second frequency. The power amplifier module in combination with a low noise amplifier circuit can form a duplexer without the inclusion of separate duplexer circuitry.

BRIEF DESCRIPTION OF THE DRAWINGS

Throughout the drawings, reference numbers are re-used to indicate correspondence between referenced elements. The drawings are provided to illustrate embodiments of the inventive subject matter described herein and not to limit the scope thereof.

FIG. 8 is an example of antenna sharing using a passive duplexer.

DETAILED DESCRIPTION

Figure 1:
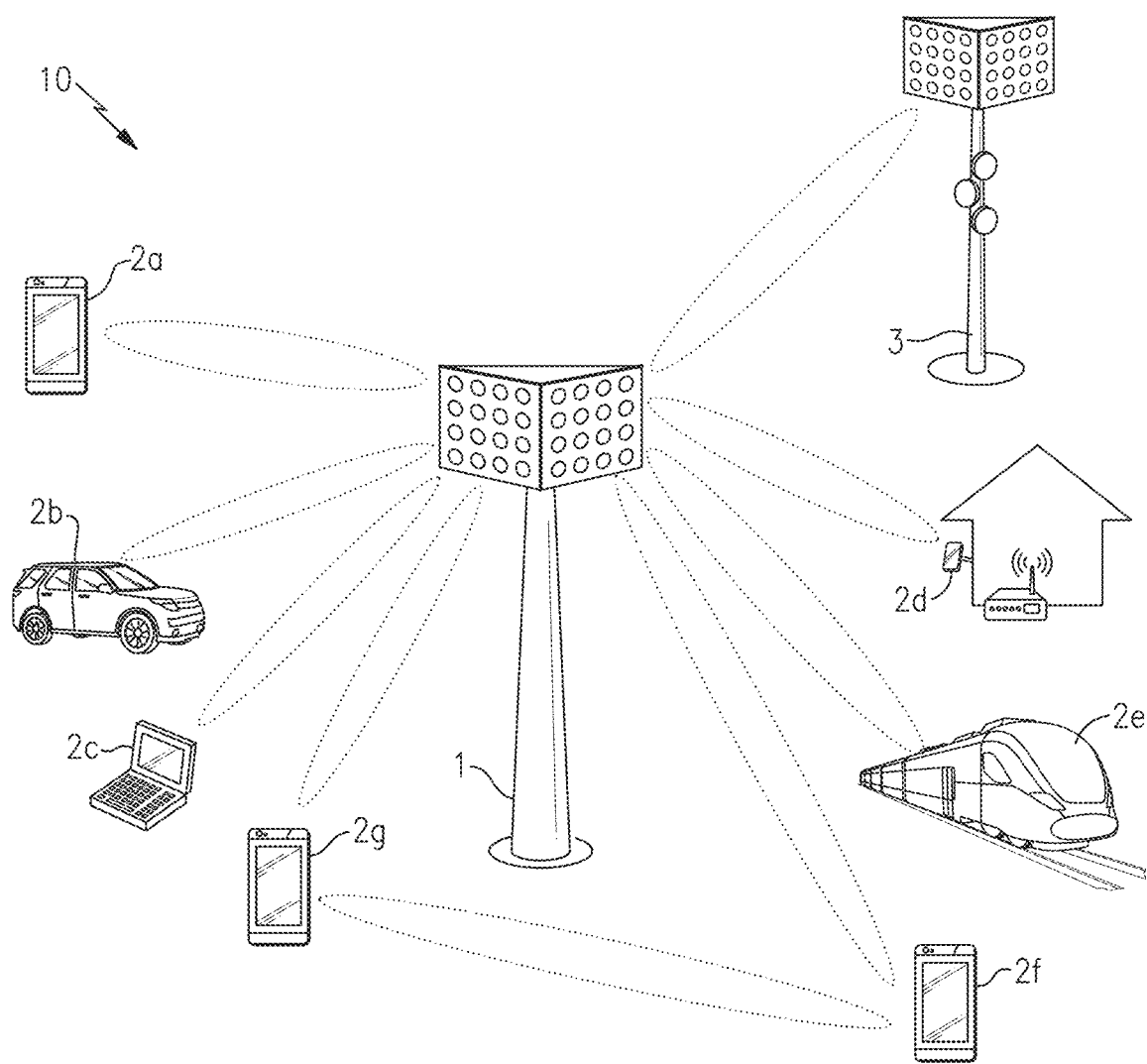
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

In this description, references to "an embodiment," "one embodiment," or the like, mean that the particular feature, function, structure or characteristic being described is included in at least one embodiment of the technique introduced herein. Occurrences of such phrases in this specification do not necessarily all refer to the same embodiment. On the other hand, the embodiments referred to are also not necessarily mutually exclusive.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and plans to introduce Phase 2 of 5G technology in Release 16 (targeted for 2019). Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The techniques herein are applicable to a wide variety of communication systems, including, but not limited to, communication systems using advanced cellular technologies, such as LTE-Advanced, LTE-Advanced Pro, and/or 5G NR.

Introduction

Some devices that communicate wirelessly may have multiple antennas. Further, some wireless devices may communicate over different frequency bands. In some such devices, one antenna may be used to transmit signals of a first frequency or first frequency band, and another antenna may be used to receive signals of a second frequency or second frequency band. The use of multiple antennas can use up valuable space on a wireless device. Further, interference may be caused by signals being received and/or transmitted by different antennas on the wireless device.

One solution is to reduce the number of antennas by using a duplexer. The duplexer enables a transmitter and receiver to share an antenna. A duplexer may separate a transmitted signal and a received signal into two separate routing or communication paths within a wireless device. A duplexer is often made from passive devices and may be referred to as a "passive duplexer."

FIG. 8 is an example of antenna sharing using a passive duplexer. As illustrated in FIG. 8, a portion of a wireless device 800 may include an antenna 802 configured to transmit signals of a first frequency, $f_1$, may receive the signals from a power amplifier 804. Further, an antenna 806 configured to receive signals of a second frequency, $f_2$, may provide the signals to a low noise amplifier 808. The power amplifier 804 and the low noise amplifier 808 may be included in a front-end module and/or a transceiver.

The illustrated portion of the wireless device 800 may be replaced by a portion of a wireless device 810. As illustrated in FIG. 8, the power of the wireless device 810 may combine the antennas 802, 806 into a single antenna 812. The antenna 812 may both transmit signals of a frequency $f_1$ and receive signals of a frequency $f_2$. To prevent signals from the power amplifier 804 being provided to the low noise amplifier 808 and/or signals received from the antenna 812 being provided to the power amplifier 804 instead of the low noise amplifier 808, the wireless device 810 may include a passive duplexer 814. As with the power amplifier 804 and the low noise amplifier 808, the passive duplexer 814 may be included in a front-end module and/or a transceiver. The front-end module and/or transceiver may be connected to the antenna 812.

The inclusion of a passive duplexer may increase the size of the front-end module. Further, the passive duplexer may introduce loss into the signal path, which may degrade the performance of the communication system (e.g., the front-end module, transceiver, or other components within the communication path of the communication system) of a wireless device.

Certain aspects of the present disclosure replace the passive duplexer with an active duplexer that uses metamaterial matching circuits. The active duplexer can be formed from a power amplifier circuit and a low noise amplifier circuit that each include a metamaterial matching circuit. The combination of a power amplifier circuit and a low noise amplifier circuit that each utilize metamaterials to form the associated matching circuit provide the functionality of a duplexer without including the additional circuitry of a stand-alone or passive duplexer. In other words, in certain cases, the front-end module can provide duplexer functionality without including a separate duplexer. Advantageously, in certain cases, the size of the front-end module can be reduced by eliminating the passive duplexer. Further, the loss introduced into the signal path by the passive duplexer is eliminated improving the performance of the communication system that includes the active duplexer.

Example Communication Network

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the techniques herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Example Carrier Aggregation Communication Link

Figure 2A:
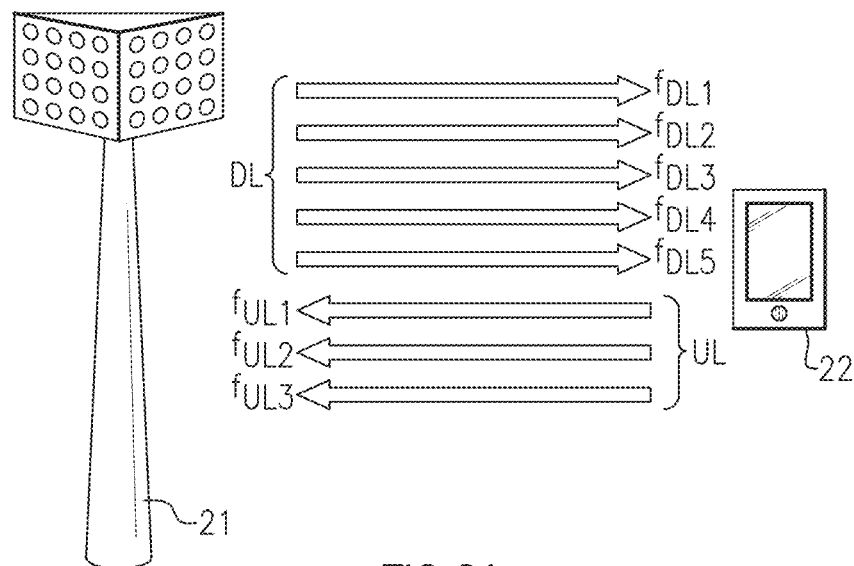
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
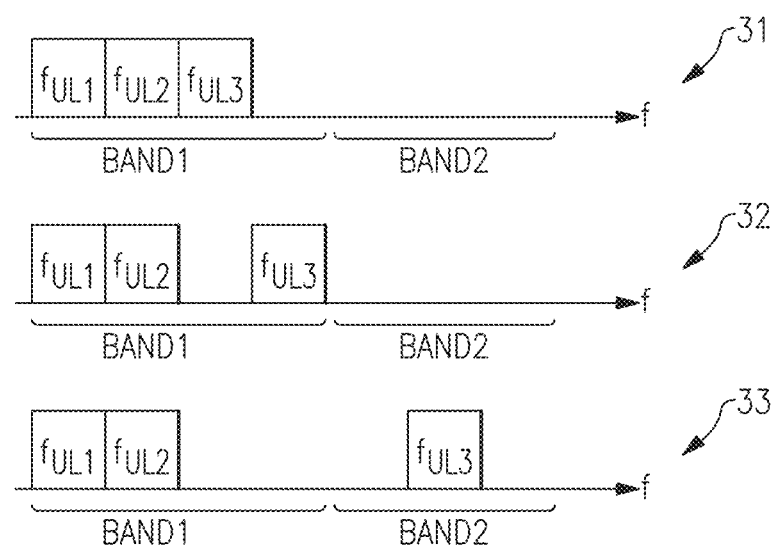
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
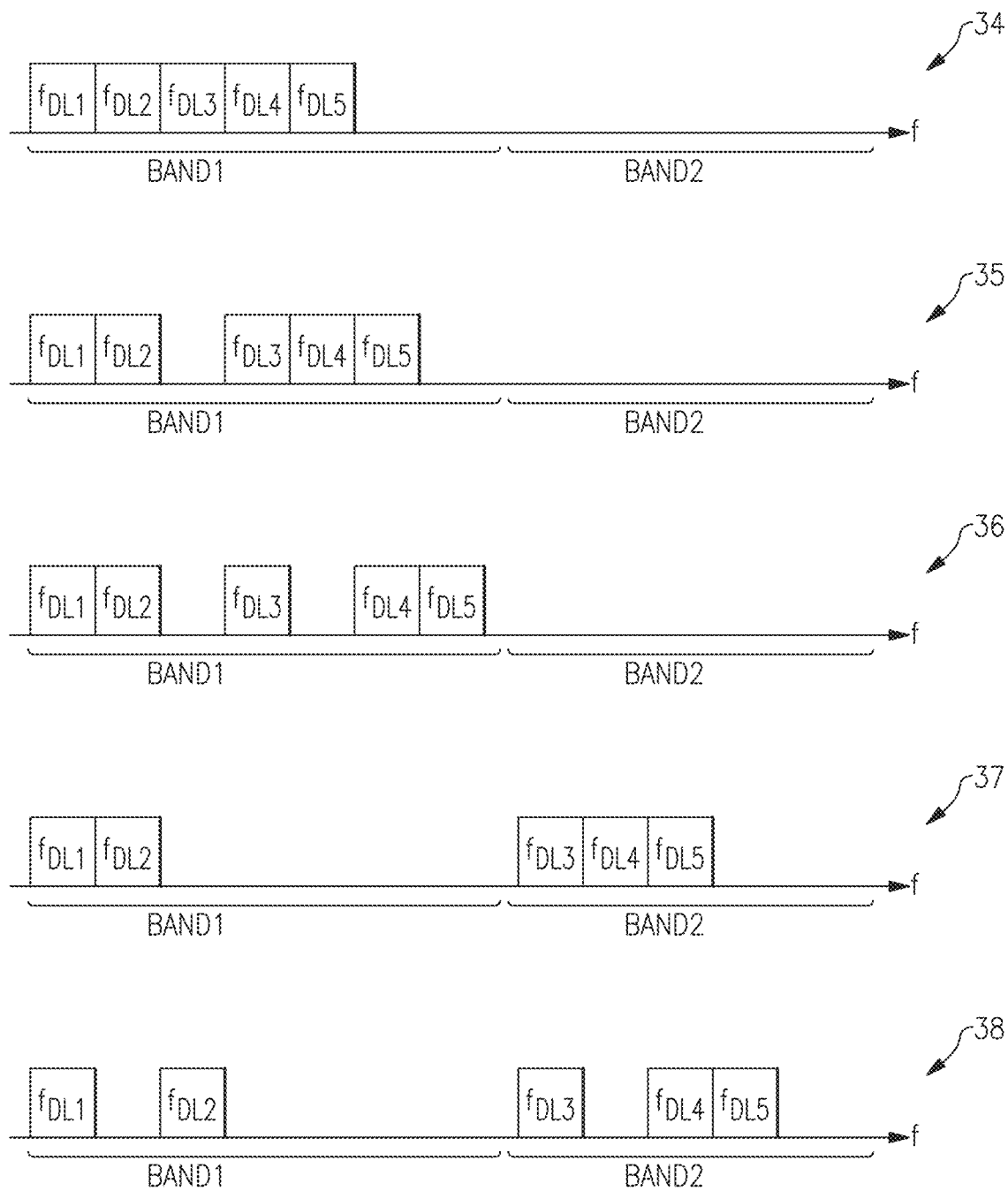
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink.

Example MIMO Communication

Figure 3A:
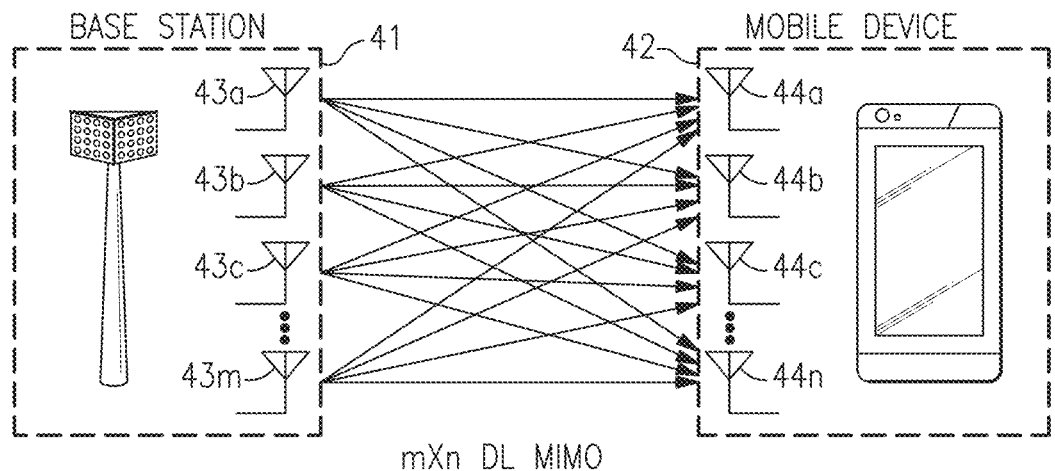
FIG. 3A is a schematic diagram of one example of a downlink channel using multi-input and multi-output (MIMO) communications.
Figure 3B:
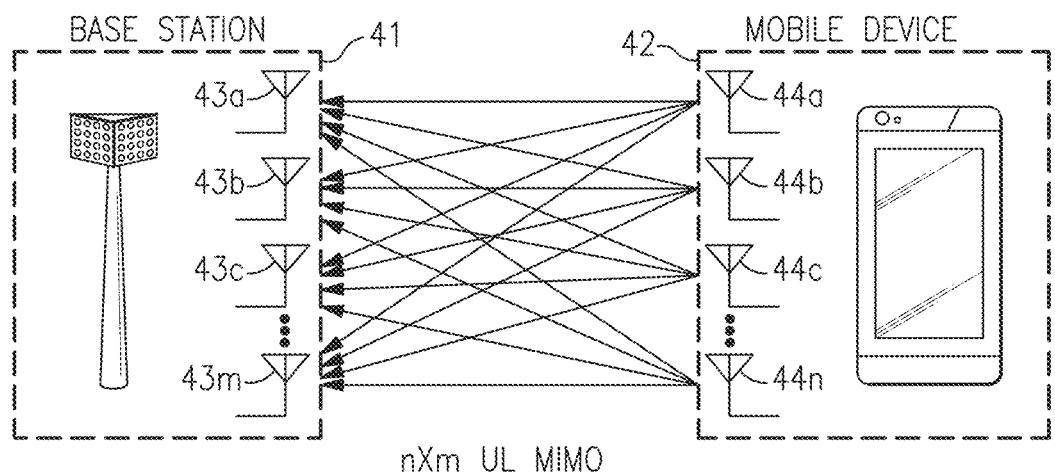
FIG. 3B is schematic diagram of one example of an uplink channel using MIMO communications.

FIG. 3A is a schematic diagram of one example of a downlink channel using multi-input and multi-output (MIMO) communications. FIG. 3B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 3A, downlink MIMO communications are provided by transmitting using M antennas 43a, 43b, 43c, . . . 43m of the base station 41 and receiving using N antennas 44a, 44b, 44c, . . . 44n of the mobile device 42. Accordingly, FIG. 3A illustrates an example of m×n DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 3B, uplink MIMO communications are provided by transmitting using N antennas 44a, 44b, 44c, . . . 44n of the mobile device 42 and receiving using M antennas 43a, 43b, 43c, . . . 43m of the base station 41. Accordingly, FIG. 3B illustrates an example of n×m UL MIMO.

By increasing the level or order of MIMO, bandwidth of an uplink channel and/or a downlink channel can be increased.

MIMO communications are applicable to communication links of a variety of types, such as FDD communication links and TDD communication links.

Figure 3C:
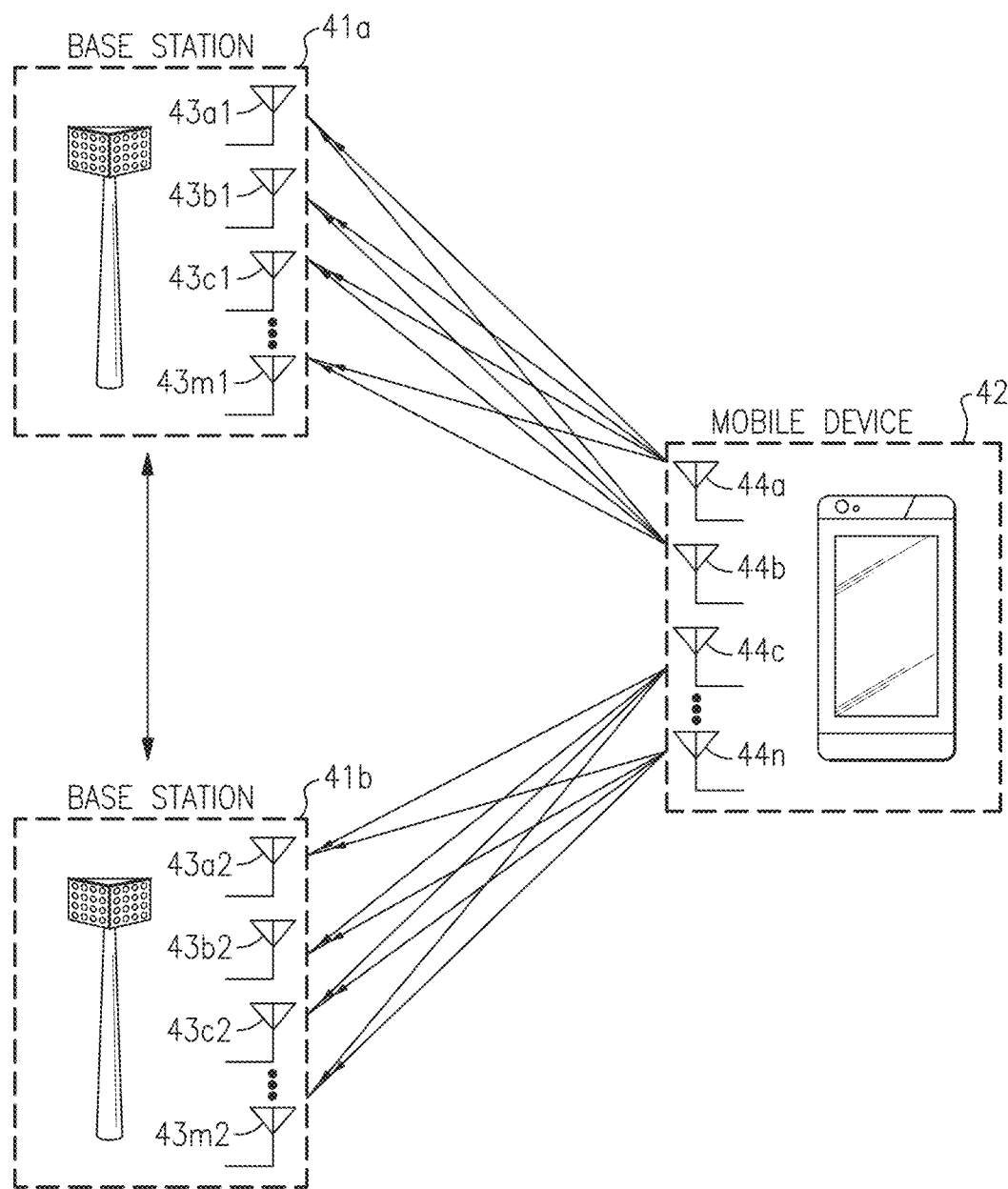
FIG. 3C is schematic diagram of another example of an uplink channel using MIMO communications.

FIG. 3C is schematic diagram of another example of an uplink channel using MIMO communications. In the example shown in FIG. 3C, uplink MIMO communications are provided by transmitting using N antennas 44a, 44b, 44c, . . . 44n of the mobile device 42. Additional a first portion of the uplink transmissions are received using M antennas 43a1, 43b1, 43c1, . . . 43m1 of a first base station 41a, while a second portion of the uplink transmissions are received using M antennas 43a2, 43b2, 43c2, . . . 43m2 of a second base station 41b. Additionally, the first base station 41a and the second base station 41b communication with one another over wired, optical, and/or wireless links.

The MIMO scenario of FIG. 3C illustrates an example in which multiple base stations cooperate to facilitate MIMO communications.

Second Example Communication Network

Figures 4A, 4B:
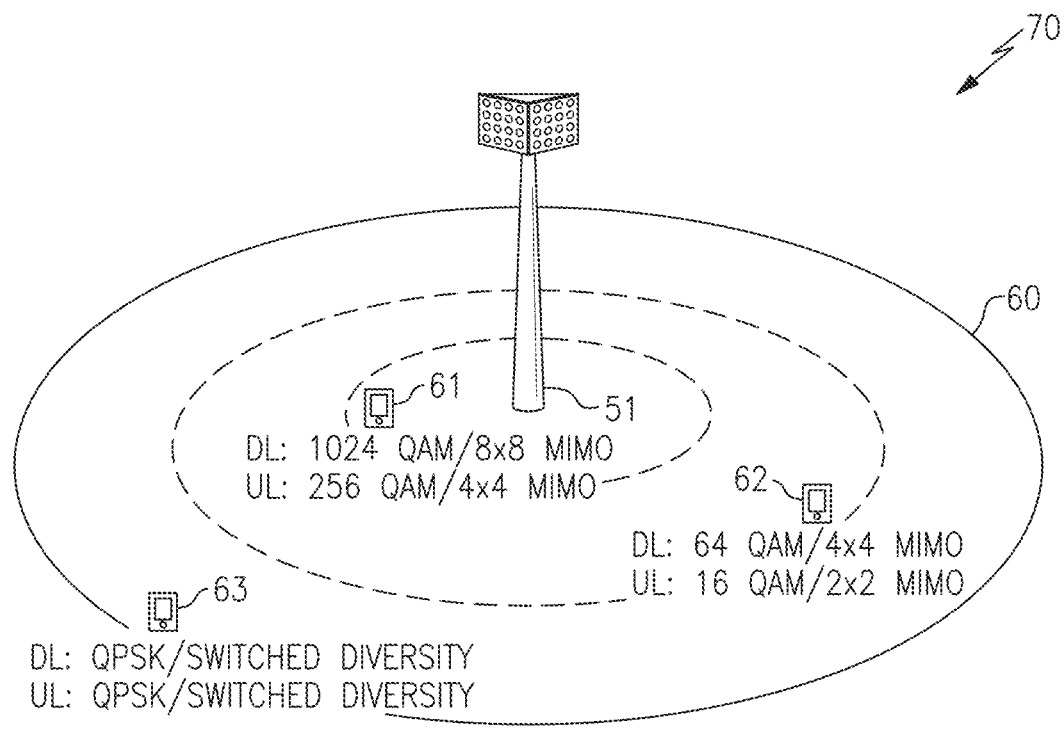
FIG. 4A is a schematic diagram of another example of a communication network.
FIG. 4B is a schematic diagram illustrating various examples of signal modulation for a communication network.

FIG. 4A is a schematic diagram of another example of a communication network 70. The communication network 70 includes a base station 41 and various mobile devices 61-63. The base station 51 serves a land area or cell 60. Additionally, the mobile devices 61-63 are located in different locations of the cell 60 associated with different distances to the base station 51.

Although one example of a communication network is shown, other configurations are possible, including, for example, communication networks with other numbers and/or types of user devices and/or base stations.

FIG. 4B is a schematic diagram illustrating various examples of signal modulation for a communication network, such as the communication network 70 of FIG. 4A.

Various constellation diagrams are depicted in FIG. 4B, including a quadrature phase shift keying (QPSK) constellation diagram 71, a 16 quadrature amplitude modulation (QAM) constellation diagram 72, a 64 QAM constellation diagram 73, a 256 QAM constellation diagram 74, and a 1024 QAM constellation diagram 75.

The constellation diagrams 71-75 each illustrate a complex plane including possible symbols that can be selected for the associated modulation scheme.

For example, QPSK modulation includes four symbols, each corresponding to one of four carrier phase shifts (for instance, 0°, 90°, 180°, or 270°). QPSK can be used to carry 2 bits per symbol.

QAM modulation includes symbols having different proportions of quadrature carrier signals. For example, by changing the amplitudes of an in-phase carrier signal (for instance, a sine carrier wave) relative to a quadrature-phase carrier signal (for instance, a cosine carrier wave) different symbols can be achieved.

The number of symbols and bits per symbol changes with an order or level of QAM modulation. For example, 16 QAM includes 16 symbols, with 4 bits per symbol. Additionally, 64 QAM includes 64 symbols, with 6 bits per symbol. Furthermore, 256 QAM includes 256 symbols, with 8 bits per symbol. Additionally, 1024 QAM includes 1024 symbols, with 10 bits per symbol.

QPSK and QAM illustrate examples of modulation formats suitable for 5G communication systems. However, other types of modulation formats are possible, including, but not limited to, a wide variety of modulation formats employing frequency-shift keying (FSK), amplitude-shift keying (ASK), and/or phase-shift keying (PSK).

Advanced cellular technologies, such as LTE-Advanced Pro and 5G NR, employ complex modulation schemes to increase a number of bits per symbol or data density. By using complex modulation schemes, spectral efficiency can be increased.

Certain communication systems dynamically control modulation (for instance, a modulation format and/or level of modulation) based on a quality of a communication link.

For example, it can be difficult to receive a signal with accuracy when SNR is relatively low. Thus, as a number of symbols in a constellation increases, it can become increasing more difficult to determine which symbol has been communicated. Accordingly, certain communication systems dynamical control modulation based on SNR.

SNR is a function of a variety of factors, such as radio environment, proximity to sources of signal interference or noise, and/or quality or performance of the communication systems transmitting and receiving over the communication link.

With reference to FIGS. 4A and 4B, the mobile devices 61-63 are at varying distances from the base station 51. Additionally, the first mobile device 61 operates with a higher SNR than the second mobile device 62, which in turn operates with higher SNR than the third mobile device 63, in this example.

In certain implementations, a selected modulation format for uplink and/or downlink can be dynamically adjusted or changed based on SNR.

For instance, in the example illustrated in FIG. 4A, the first mobile device 61 with high SNR communicates with 1024 QAM for DL and 256 QAM for UL. Additionally, the second mobile device 61 with moderate SNR communicates with 64 QAM for DL and 16 QAM for UL, and the third mobile device 63 with low SNR communicates with QPSK for UL and DL. As the mobile device 61-63 move throughout the cell 60, modulation can be dynamically adapted based on SNR.

Although one specific example of modulation formats and levels for various mobile devices are shown, other modulation formats and/or levels are possible.

UE for advanced cellular technologies include multiple antennas for communications. In certain implementations, a mobile device that supports MIMO communications can also be used for switched diversity communications. In contrast to MIMO in which multiple antennas are simultaneously used for communication, switched diversity refers to communications in which a particular antenna is selected for operation at a particular time. For example, a switch can be used to select a particular antenna from a group of antennas based on a variety of factors, such as an observed bit error rate and/or a signal strength indicator.

In certain communication networks, MIMO is used when SNR is relatively high, and switched diversity is used when SNR is relatively low. For example, when a mobile device is relatively close to a base station, MIMO communications can be used to increase data rate. Additionally, when the mobile device is relatively far from the base station, switched diversity can be used to improve SNR. Moreover, when MIMO communications are being used, an order of MIMO for uplink and/or downlink can change based on SNR. Thus, a mobile device including multiple antennas can dynamically change between MIMO communications (including an order of MIMO used) and switched diversity communications based on radio environment.

For instance, in the example illustrated in FIG. 4A, the first mobile device 61 with high SNR communicates with 8×8 DL MIMO and 4×4 UL MIMO. Additionally, the second mobile device 61 with moderate SNR communicates with 4×4 DL MIMO and 2×2 UL MIMO, and the third mobile device 63 with low SNR communicates with switched diversity for both DL and UL. As the mobile device 61-63 move throughout the cell 60, the antenna usage can be dynamically adapted or changed based on SNR.

Although one specific example of multiple antenna control for various mobile devices is shown, other examples are possible.

Figure 4C:
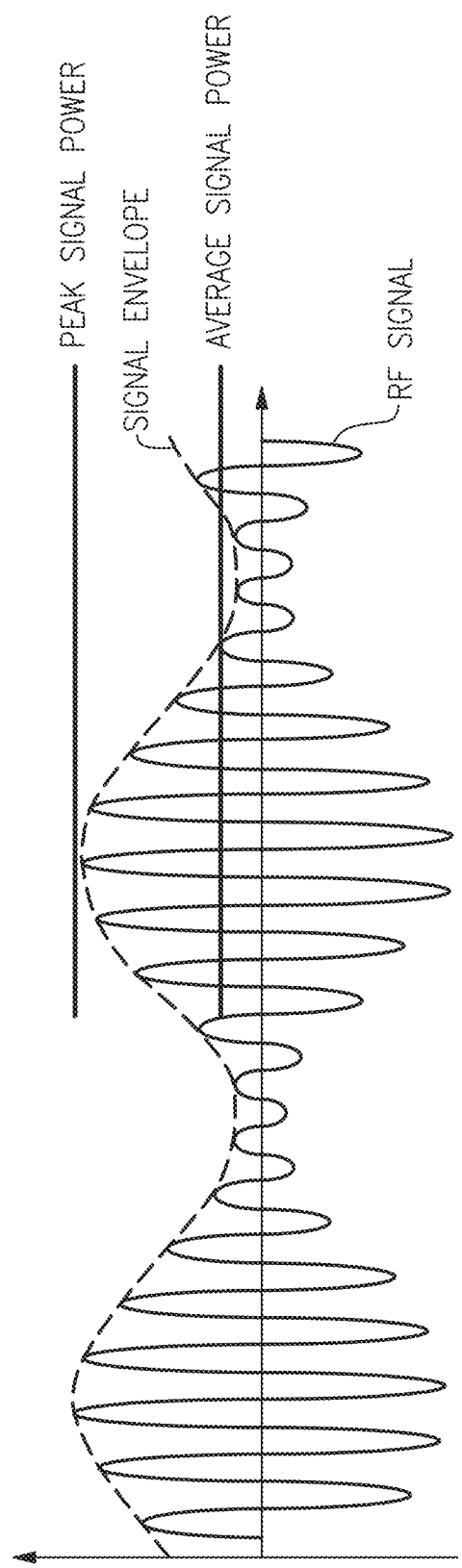
FIG. 4C is a graph illustrating one example of an RF signal waveform versus time.

FIG. 4C is a graph illustrating one example of an RF signal waveform versus time. The graph depicts the RF signal waveform, the envelope of the RF signal, the average signal power, and the peak signal power. The peak to average power ratio (PAPR) or crest factor of the RF signal waveform corresponds to the ratio of the waveform's peak signal power to the waveform's average signal power.

Figure 4D:
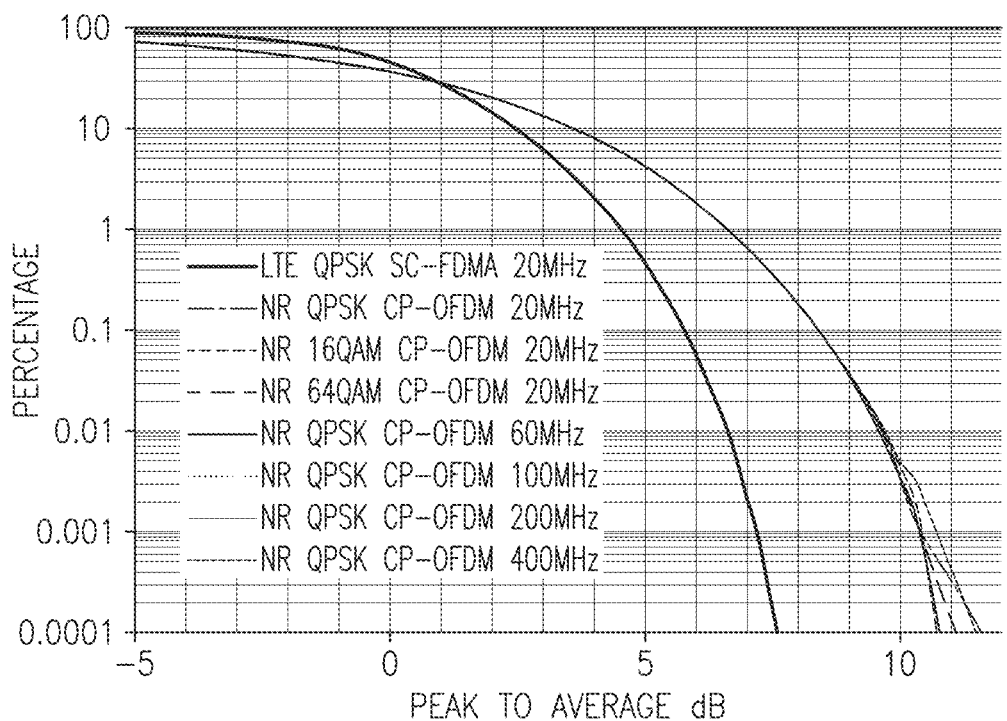
FIG. 4D is one example of a peak to average power ratio (PAPR) complementary cumulative distribution function (CCDF) for various cyclic prefix orthogonal frequency division multiplexing (CP-OFDM) waveforms relative to a single carrier frequency division multiple access (SC-FDMA) reference waveform.

FIG. 4D is one example of a PAPR complementary cumulative distribution function (CCDF) for various cyclic prefix orthogonal frequency division multiplexing (CP-OFDM) waveforms relative to a single carrier frequency division multiple access (SC-FDMA) reference waveform.

As shown in FIG. 4D, the PAPR CCDF is shown for a variety of modulation orders and bandwidths of CP-OFDM 5G NR waveforms. For the example waveforms shown, higher order modulations and wider signal bandwidth does not substantially increase PAPR, but rather the CP-OFDM waveforms have similar PAPR to one another.

When comparing 5G NR CP-OFDM waveforms to the reference LTE SC-FDMA QPSK waveform it can be seen that the 5G NR waveforms exhibit higher PAPR of about 3 dB or more. The higher PAPR raises a linearity constraint for a power amplifier. Moreover, for UE operating at a cell edge and/or with poor SNR, higher PAPR can constrain output power and/or increase battery current.

Figure 4E:
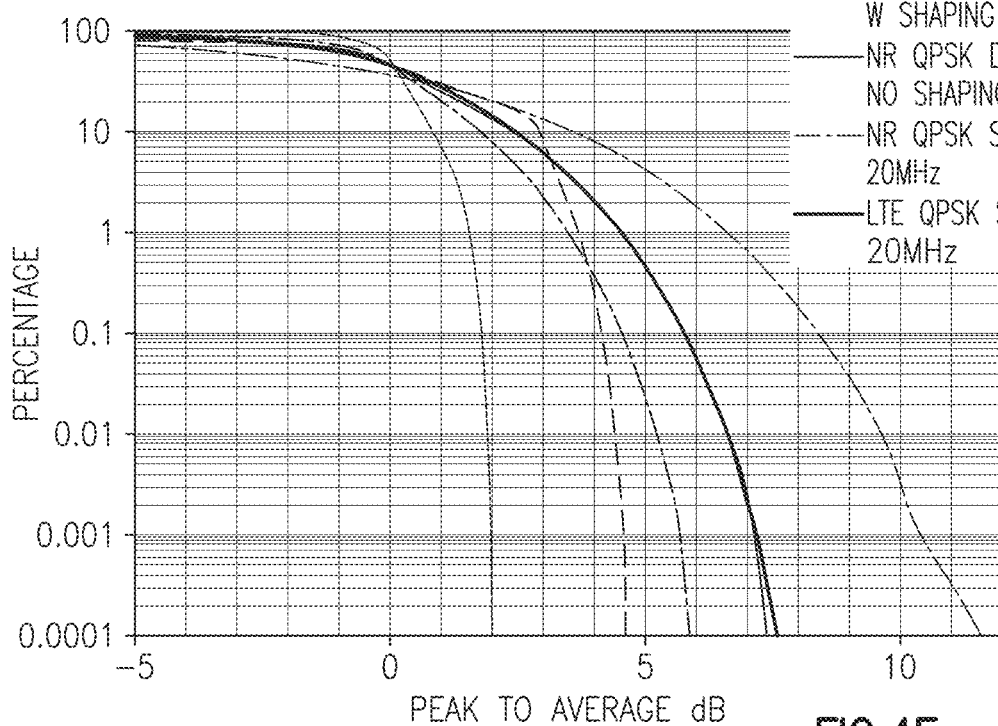
FIG. 4E is one example of a PAPR CCDF for various discrete Fourier transformation-spread-orthogonal frequency division multiplexing (DFT-s-OFDM) waveforms relative to a SC-FDMA reference waveform and a quadrature phase shift keying (QPSK) CP-OFDM 20 megahertz (MHz) waveform.

FIG. 4E is one example of a PAPR CCDF for various discrete Fourier transformation-spread-orthogonal frequency division multiplexing (DFT-s-OFDM) waveforms relative to a SC-FDMA reference waveform and a QPSK CP-OFDM 20 MHz waveform.

As shown in FIG. 4E, the PAPR CCDF is shown for a variety of modulation order and bandwidths of CP-OFDM 5G NR waveforms, with or without spectral shaping. The QPSK DFT-s-OFDM 20 MHz waveform without shaping has similar PAPR behavior as the reference LTE SC-FDMA QPSK waveform.

As shown by a comparison of FIGS. 4D and 4E, the DFT-s-OFDM waveforms of FIG. 4E operate with lower PAPR relative to the CP-OFDM waveforms of FIG. 4D. In certain implementations half pi (PI/2) binary phase shift keying (BPSK) and/or spectral shaping techniques can be used to reduce PAPR. For instance, for the examples shown, spectral shaping techniques selectively enable 2 dB PAPR improvement for QPSK and 5 dB improvement for PI/2 BPSK DFT-s-OFDM waveforms when compared to the reference LTE signal.

Figure 4F:
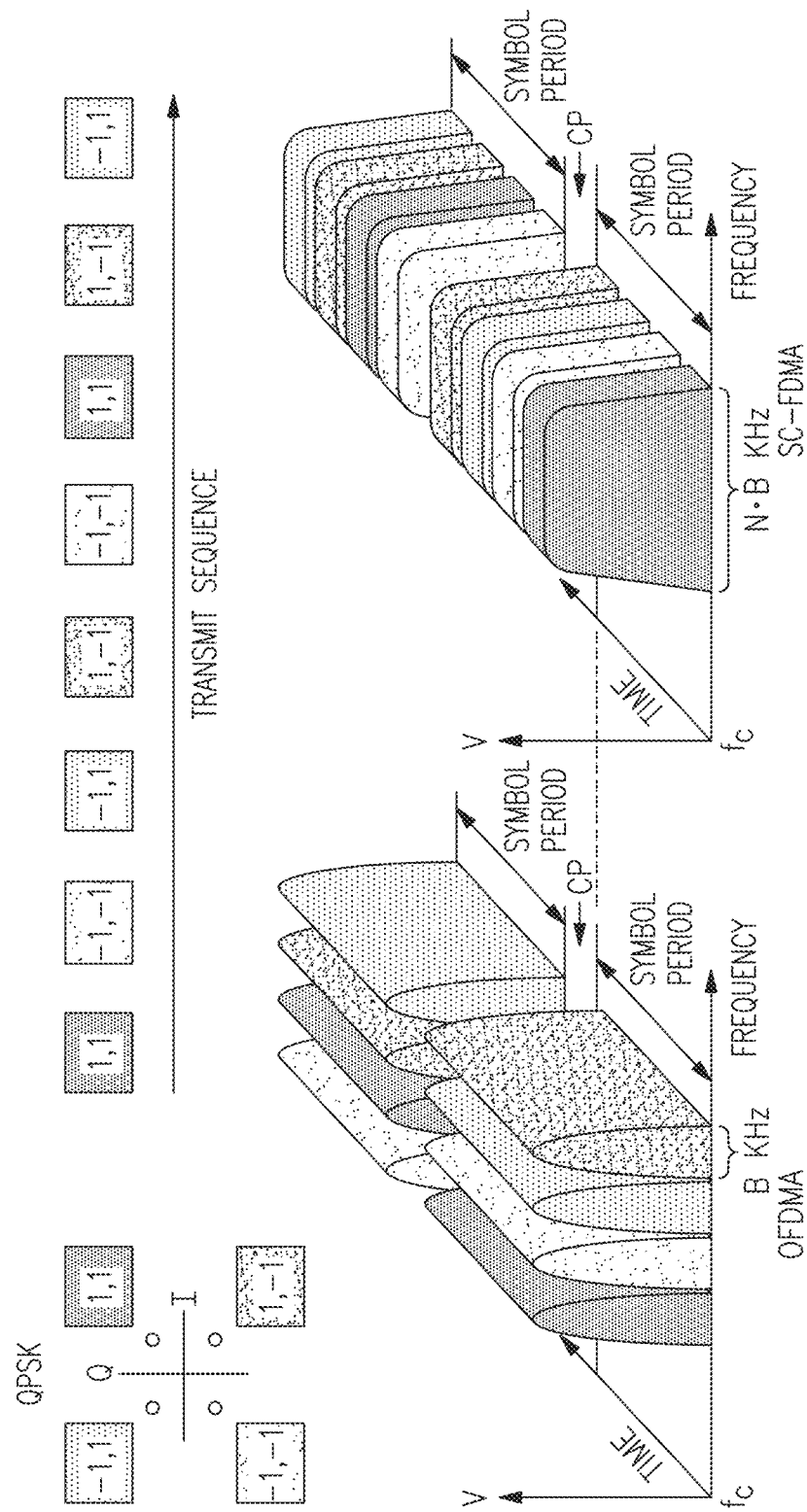
FIG. 4F is a schematic diagram illustrating two examples of multiple access schemes for a communication network.

FIG. 4F is a schematic diagram illustrating two examples of multiple access schemes for a communication network. Examples of frequency versus voltage versus time for OFDMA and SC-FDMA are depicted in FIG. 4F.

The examples are shown for an illustrated transmit sequence of different QPSK modulating data symbols, in this embodiment. As shown in FIG. 4F, SC-FDMA includes data symbols occupying greater bandwidth (N*B KHz, where N=4 in this example) relative to OFDMA data symbols (B KHz). However, the SC-FDMA data symbols occupy the greater bandwidth for a fraction of time (1/N) relative to that of the OFDMA data symbols. FIG. 4F has also been annotated to show times of transmitting a cyclic prefix (CP).

Example Beamforming Communication System

Figure 5A:
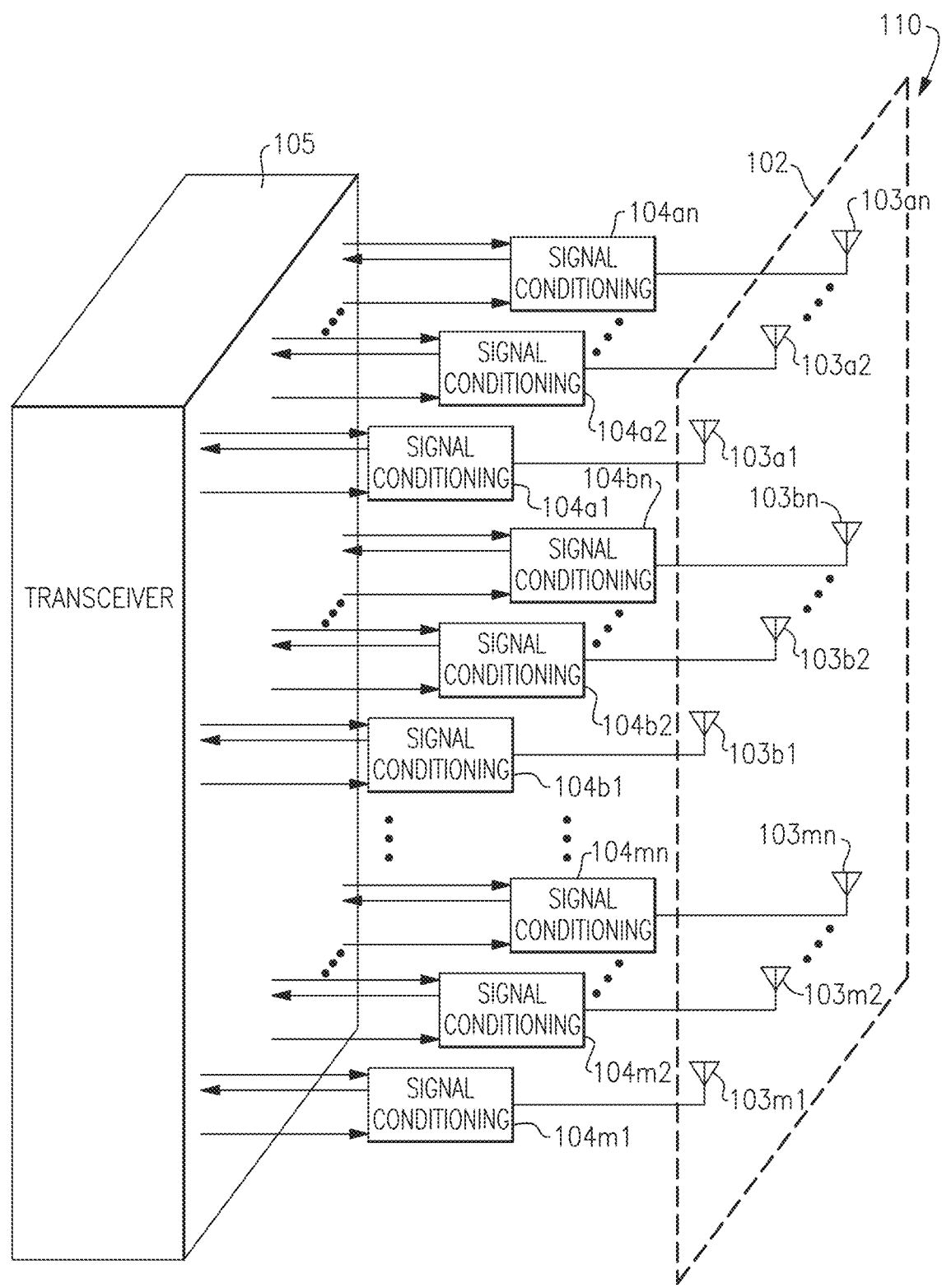
FIG. 5A is a schematic diagram of one example of a communication system that operates with beamforming.

FIG. 5A is a schematic diagram of one example of a communication system 110 that operates with beamforming. The communication system 110 includes a transceiver 105, signal conditioning circuits 104$a1$, 104$a2$ ... 104$an$, 104$b1$, 104$b2$ ... 104$bn$, 104$m1$, 104$m2$ ... 104$mn$, and an antenna array 102 that includes antenna elements 103$a1$, 103$a2$ ... 103$an$, 103$b1$, 103$b2$ ... 103$bn$, 103$m1$, 103$m2$ ... 103$mn$.

Communications systems that communicate using millimeter wave carriers (for instance, 30 GHz to 300 GHz), centimeter wave carriers (for instance, 3 GHz to 30 GHz), and/or other frequency carriers can employ an antenna array to provide beam formation and directivity for transmission and/or reception of signals.

For example, in the illustrated embodiment, the communication system 110 includes an array 102 of m×n antenna elements, which are each controlled by a separate signal conditioning circuit, in this embodiment. As indicated by the ellipses, the communication system 110 can be implemented with any suitable number of antenna elements and signal conditioning circuits.

With respect to signal transmission, the signal conditioning circuits can provide transmit signals to the antenna array 102 such that signals radiated from the antenna elements combine using constructive and destructive interference to generate an aggregate transmit signal exhibiting beam-like qualities with more signal strength propagating in a given direction away from the antenna array 102.

In the context of signal reception, the signal conditioning circuits process the received signals (for instance, by separately controlling received signal phases) such that more signal energy is received when the signal is arriving at the antenna array 102 from a particular direction. Accordingly, the communication system 110 also provides directivity for reception of signals.

The relative concentration of signal energy into a transmit beam or a receive beam can be enhanced by increasing the size of the array. For example, with more signal energy focused into a transmit beam, the signal is able to propagate for a longer range while providing sufficient signal level for RF communications. For instance, a signal with a large proportion of signal energy focused into the transmit beam can exhibit high effective isotropic radiated power (EIRP).

In the illustrated embodiment, the transceiver 105 provides transmit signals to the signal conditioning circuits and processes signals received from the signal conditioning circuits. As shown in FIG. 5A, the transceiver 105 generates control signals for the signal conditioning circuits. The control signals can be used for a variety of functions, such as controlling the gain and phase of transmitted and/or received signals to control beamforming.

Figure 5B:
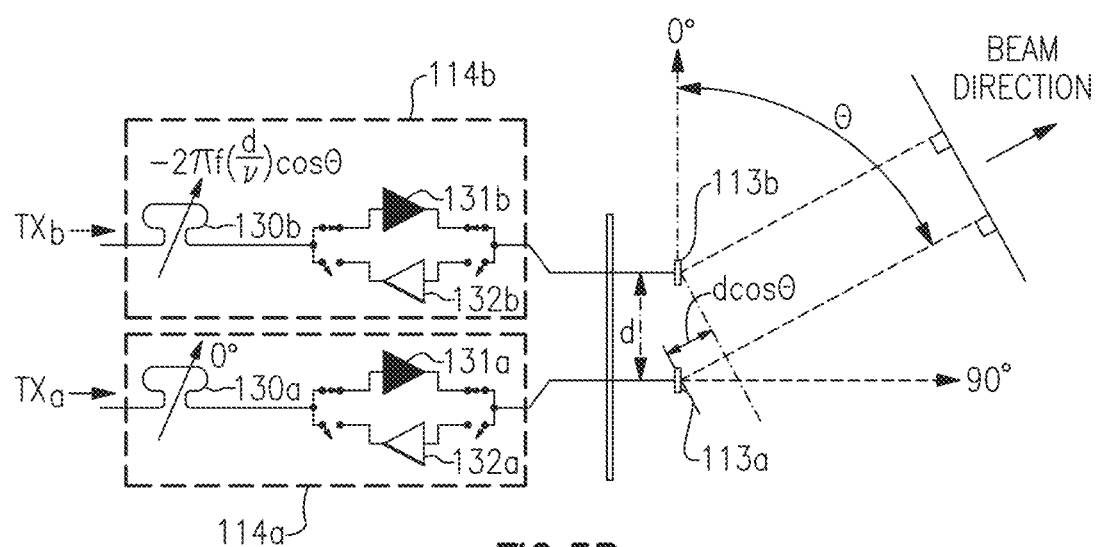
FIG. 5B is a schematic diagram of one example of beamforming to provide a transmit beam.

FIG. 5B is a schematic diagram of one example of beamforming to provide a transmit beam. FIG. 5B illustrates a portion of a communication system including a first signal conditioning circuit 114a, a second signal conditioning circuit 114b, a first antenna element 113a, and a second antenna element 113b.

Although illustrated as included two antenna elements and two signal conditioning circuits, a communication system can include additional antenna elements and/or signal conditioning circuits. For example, FIG. 5B illustrates one embodiment of a portion of the communication system 110 of FIG. 5A.

The first signal conditioning circuit 114a includes a first phase shifter 130a, a first power amplifier 131a, a first low noise amplifier (LNA) 132a, and switches for controlling selection of the power amplifier 131a or LNA 132a. Additionally, the second signal conditioning circuit 114b includes a second phase shifter 130b, a second power amplifier 131b, a second LNA 132b, and switches for controlling selection of the power amplifier 131b or LNA 132b.

Although one embodiment of signal conditioning circuits is shown, other implementations of signal conditioning circuits are possible. For instance, in one example, a signal conditioning circuit includes one or more band filters, duplexers, and/or other components.

In the illustrated embodiment, the first antenna element 113a and the second antenna element 113b are separated by a distance d. Additionally, FIG. 5B has been annotated with an angle θ, which in this example has a value of about 90° when the transmit beam direction is substantially perpendicular to a plane of the antenna array and a value of about 0° when the transmit beam direction is substantially parallel to the plane of the antenna array.

By controlling the relative phase of the transmit signals provided to the antenna elements 113a, 113b, a desired transmit beam angle θ can be achieved. For example, when the first phase shifter 130a has a reference value of 0°, the second phase shifter 130b can be controlled to provide a phase shift of about $-2\pi f(d/v)\cos\theta$ radians, where f is the fundamental frequency of the transmit signal, d is the distance between the antenna elements, v is the velocity of the radiated wave, and π is the mathematic constant pi.

In certain implementations, the distance d is implemented to be about ½λ, where λ is the wavelength of the fundamental component of the transmit signal. In such implementations, the second phase shifter 130b can be controlled to provide a phase shift of about $-\pi\cos\theta$ radians to achieve a transmit beam angle θ.

Accordingly, the relative phase of the phase shifters 130a, 130b can be controlled to provide transmit beamforming. In certain implementations, a baseband processor and/or a transceiver (for example, the transceiver 105 of FIG. 5A) controls phase values of one or more phase shifters and gain values of one or more controllable amplifiers to control beamforming.

Figure 5C:
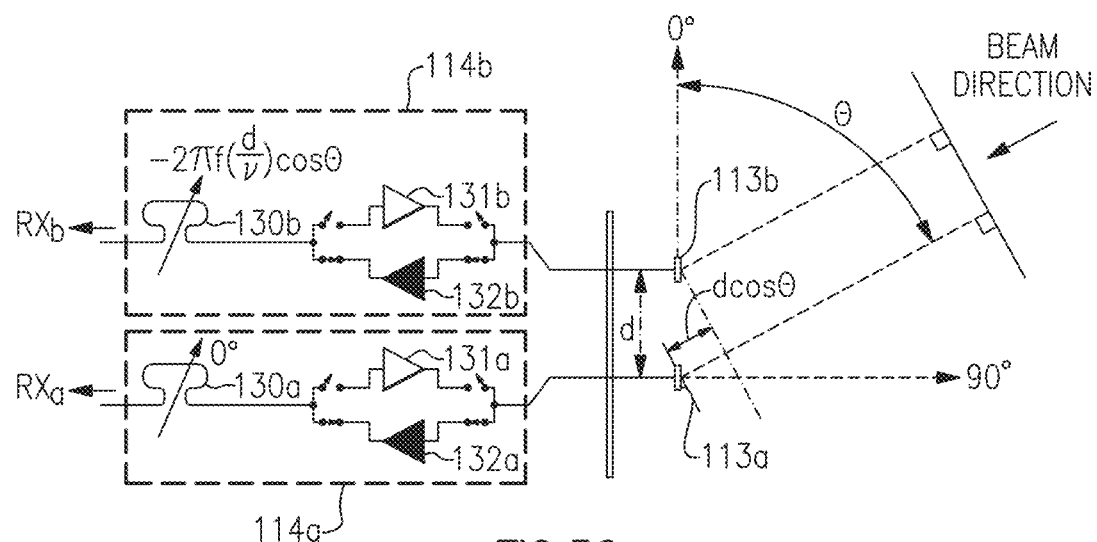
FIG. 5C is a schematic diagram of one example of beamforming to provide a receive beam.

FIG. 5C is a schematic diagram of one example of beamforming to provide a receive beam. FIG. 5C is similar to FIG. 5B, except that FIG. 5C illustrates beamforming in the context of a receive beam rather than a transmit beam.

As shown in FIG. 5C, a relative phase difference between the first phase shifter 130a and the second phase shifter 130b can be selected to about equal to $-2\pi f(d/v)\cos\theta$ radians to achieve a desired receive beam angle θ. In implementations in which the distance d corresponds to about ½λ, the phase difference can be selected to about equal to $-\pi\cos\theta$ radians to achieve a receive beam angle θ.

Although various equations for phase values to provide beamforming have been provided, other phase selection values are possible, such as phase values selected based on implementation of an antenna array, implementation of signal conditioning circuits, and/or a radio environment.

Figure 6A:
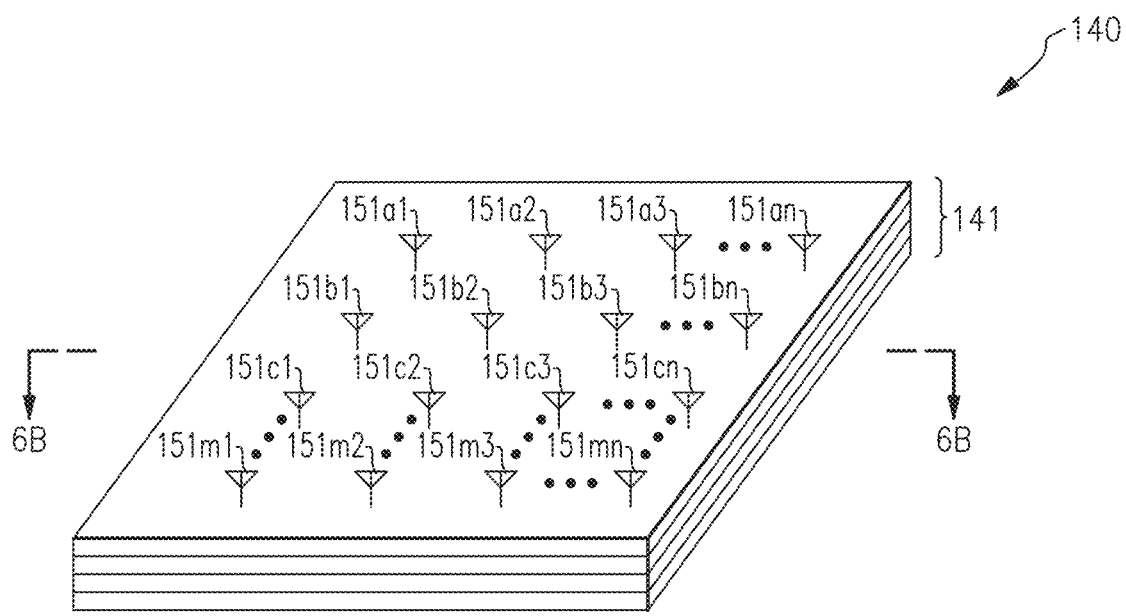
FIG. 6A is a perspective view of one embodiment of a module that operates with beamforming.
Figure 6B:
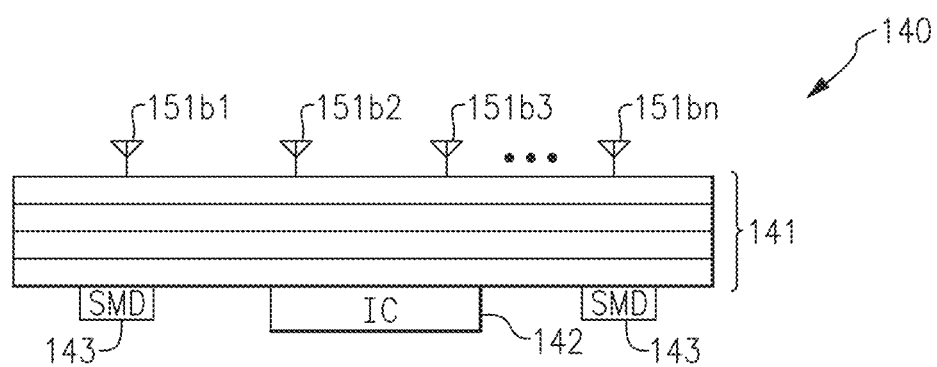
FIG. 6B is a cross-section of the module of FIG. 6A taken along the lines 6B-6B.

FIG. 6A is a perspective view of one embodiment of a module 140 that operates with beamforming. FIG. 6B is a cross-section of the module 140 of FIG. 6A taken along the lines 6B-6B.

The module 140 includes a laminated substrate or laminate 141, a semiconductor die or IC 142 (not visible in FIG. 6A), surface mount devices (SMDs) 143 (not visible in FIG. 6A), and an antenna array including antenna elements 151a1, 151a2, 151a3 . . . 151an, 151b1, 151b2, 151b3 . . . 151bn, 151c1, 151c2, 151c3 . . . 151cn, 151m1, 151m2, 151m3 . . . 151mn.

Although one embodiment of a module is shown in FIGS. 6A and 6B, the teachings herein are applicable to modules implemented in a wide variety of ways. For example, a module can include a different arrangement of and/or number of antenna elements, dies, and/or surface mount devices. Additionally, the module 140 can include additional structures and components including, but not limited to, encapsulation structures, shielding structures, and/or wirebonds.

The antenna elements antenna elements 151a1, 151a2, 151a3 . . . 151an, 151b1, 151b2, 151b3 . . . 151bn, 151c1, 151c2, 151c3 . . . 151cn, 151m1, 151m2, 151m3 . . . 151mn are formed on a first surface of the laminate 141, and can be used to receive and/or transmit signals, based on implementation. Although a 4×4 array of antenna elements is shown, more or fewer antenna elements are possible as indicated by ellipses. Moreover, antenna elements can be arrayed in other patterns or configurations, including, for instance, arrays using non-uniform arrangements of antenna elements. Furthermore, in another embodiment, multiple antenna arrays are provided, such as separate antenna arrays for transmit and receive and/or for different communication bands.

In the illustrated embodiment, the IC 142 is on a second surface of the laminate 141 opposite the first surface. However, other implementations are possible. In one example, the IC 142 is integrated internally to the laminate 141.

In certain implementations, the IC 142 includes signal conditioning circuits associated with the antenna elements 151a1, 151a2, 151a3 . . . 151an, 151b1, 151b2, 151b3 . . . 151bn, 151c1, 151c2, 151c3 . . . 151cn, 151m1, 151m2, 151m3 . . . 151mn. In one embodiment, the IC 142 includes a serial interface, such as a mobile industry processor interface radio frequency front-end (MIPI RFFE) bus and/or inter-integrated circuit (I2C) bus that receives data for controlling the signal conditioning circuits, such as the amount of phase shifting provided by phase shifters. In another embodiment, the IC 142 includes signal conditioning circuits associated with the antenna elements 151a1, 151a2, 151a3 . . . 151an, 151b1, 151b2, 151b3 . . . 151bn, 151c1, 151c2, 151c3 . . . 151cn, 151m1, 151m2, 151m3 . . . 151mn and an integrated transceiver.

The laminate 141 can include various structures including, for example, conductive layers, dielectric layers, and/or solder masks. The number of layers, layer thicknesses, and materials used to form the layers can be selected based on a wide variety of factors, and can vary with application and/or implementation. The laminate 141 can include vias for providing electrical connections to signal feeds and/or ground feeds of the antenna elements. For example, in certain implementations, vias can aid in providing electrical connections between signal conditioning circuits of the IC 142 and corresponding antenna elements.

The antenna elements 151a1, 151a2, 151a3 . . . 151an, 151b1, 151b2, 151b3 . . . 151bn, 151c1, 151c2, 151c3 . . . 151cn, 151m1, 151m2, 151m3 . . . 151mn can correspond to antenna elements implemented in a wide variety of ways. In one example, the array of antenna elements includes patch antenna element formed from a patterned conductive layer on the first side of the laminate 141, with a ground plane formed using a conductive layer on opposing side of the laminate 141 or internal to the laminate 141. Other examples of antenna elements include, but are not limited to, dipole antenna elements, ceramic resonators, stamped metal antennas, and/or laser direct structuring antennas.

The module 140 can be included in a communication system, such as a mobile phone or base station. In one example, the module 140 is attached to a phone board of a mobile phone.

Example Wireless Device

Figure 7:
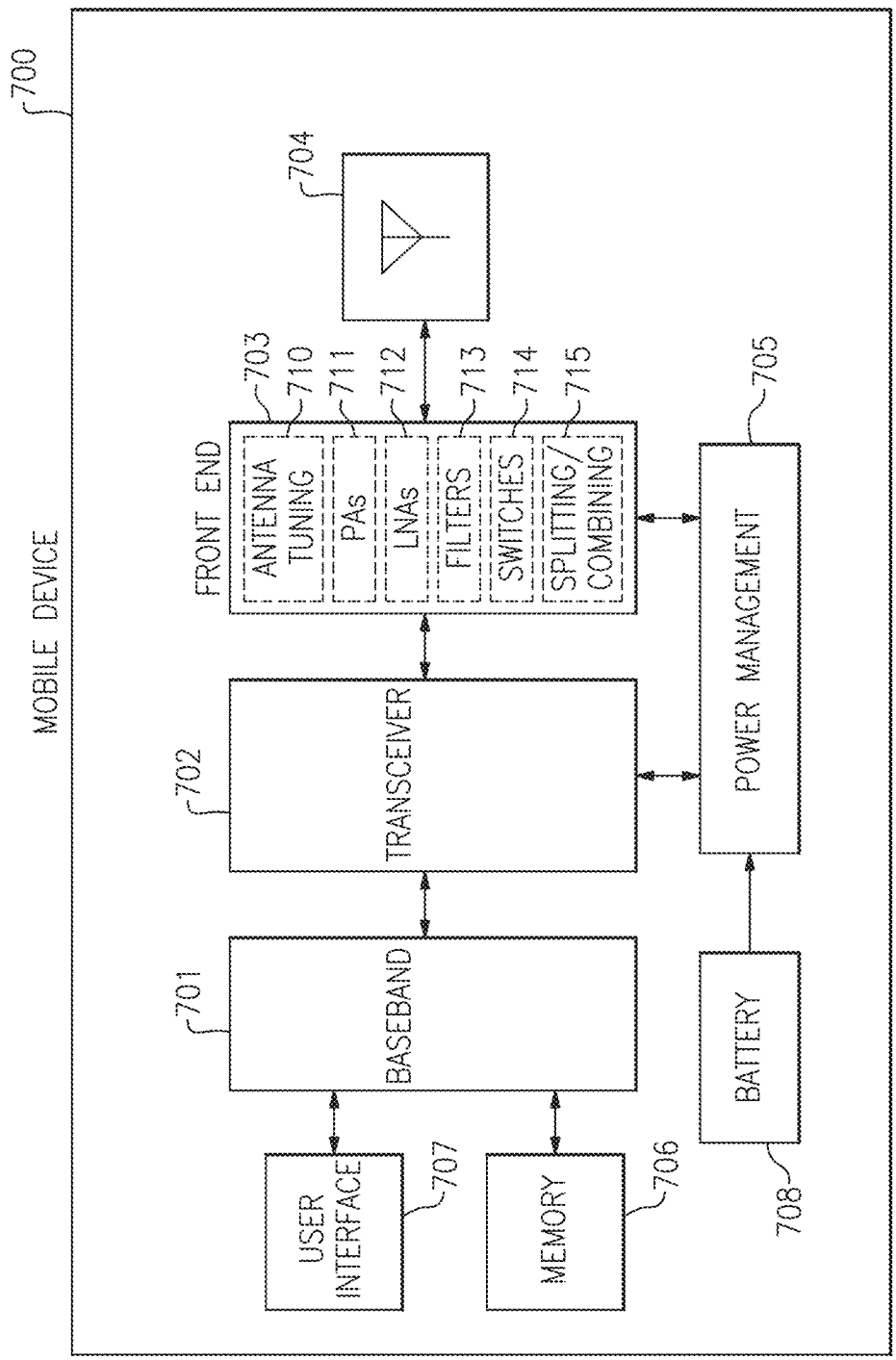
FIG. 7 is a schematic diagram of one embodiment of a mobile device.

FIG. 7 is a schematic diagram of one embodiment of a wireless device or a mobile device 700. The mobile device 700 includes a baseband system 701, a transceiver 702, a front end system 703, antennas 704, a power management system 705, a memory 706, a user interface 707, and a battery 708.

The mobile device 700 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 702 generates RF signals for transmission and processes incoming RF signals received from the antennas 704. It will be understood that various functionalities associated with the transmission and receiving of RF signals can be achieved by one or more components that are collectively represented in FIG. 7 as the transceiver 702. In one example, separate components (for instance, separate circuits or dies) can be provided for handling certain types of RF signals.

The front end system 703 aids in conditioning signals transmitted to and/or received from the antennas 704. In the illustrated embodiment, the front end system 703 includes antenna tuning circuitry 710, power amplifiers (PAs) 711, low noise amplifiers (LNAs) 712, filters 713, switches 714, and signal splitting/combining circuitry 715. However, other implementations are possible.

For example, the front end system 703 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 700 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 704 can include antennas used for a wide variety of types of communications. For example, the antennas 704 can include antennas for transmitting and/or receiving signals associated with a wide variety of frequencies and communications standards.

In certain implementations, the antennas 704 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 700 can operate with beamforming in certain implementations. For example, the front end system 703 can include amplifiers having controllable gain and phase shifters having controllable phase to provide beam formation and directivity for transmission and/or reception of signals using the antennas 704. For example, in the context of signal transmission, the amplitude and phases of the transmit signals provided to the antennas 704 are controlled such that radiated signals from the antennas 704 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 704 from a particular direction. In certain implementations, the antennas 704 include one or more arrays of antenna elements to enhance beamforming.

The baseband system 701 is coupled to the user interface 707 to facilitate processing of various user input and output (I/O), such as voice and data. The baseband system 701 provides the transceiver 702 with digital representations of transmit signals, which the transceiver 702 processes to generate RF signals for transmission. The baseband system 701 also processes digital representations of received signals provided by the transceiver 702. As shown in FIG. 7, the baseband system 701 is coupled to the memory 706 of facilitate operation of the mobile device 700.

The memory 706 can be used for a wide variety of purposes, such as storing data and/or instructions to facilitate the operation of the mobile device 700 and/or to provide storage of user information.

The power management system 705 provides a number of power management functions of the mobile device 700. In certain implementations, the power management system 705 includes a PA supply control circuit that controls the supply voltages of the power amplifiers 711. For example, the power management system 705 can be configured to change the supply voltage(s) provided to one or more of the power amplifiers 711 to improve efficiency, such as power added efficiency (PAE).

As shown in FIG. 7, the power management system 705 receives a battery voltage from the battery 708. The battery 708 can be any suitable battery for use in the mobile device 700, including, for example, a lithium-ion battery.

Example Active Duplexer

As previously described, wireless devices that support communicating over multiple frequencies or frequency bands using a single antenna may include a passive duplexer to direct signals along the appropriate signal path (e.g., the signal path configured or designed to support the frequency or frequency band of the signal). In some cases, the passive duplexer is used to prevent a received signal from interfering with a transmit signal path and to prevent a transmit signal from interfering with a receive signal path. However, the passive duplexer can introduce loss, and can increase the cost and size of a front-end module or transceiver. The active duplexer described herein can reduce or eliminate the loss and increased cost and size of the front-end module and/or transceiver attributed to the passive duplexer.

Figure 9:
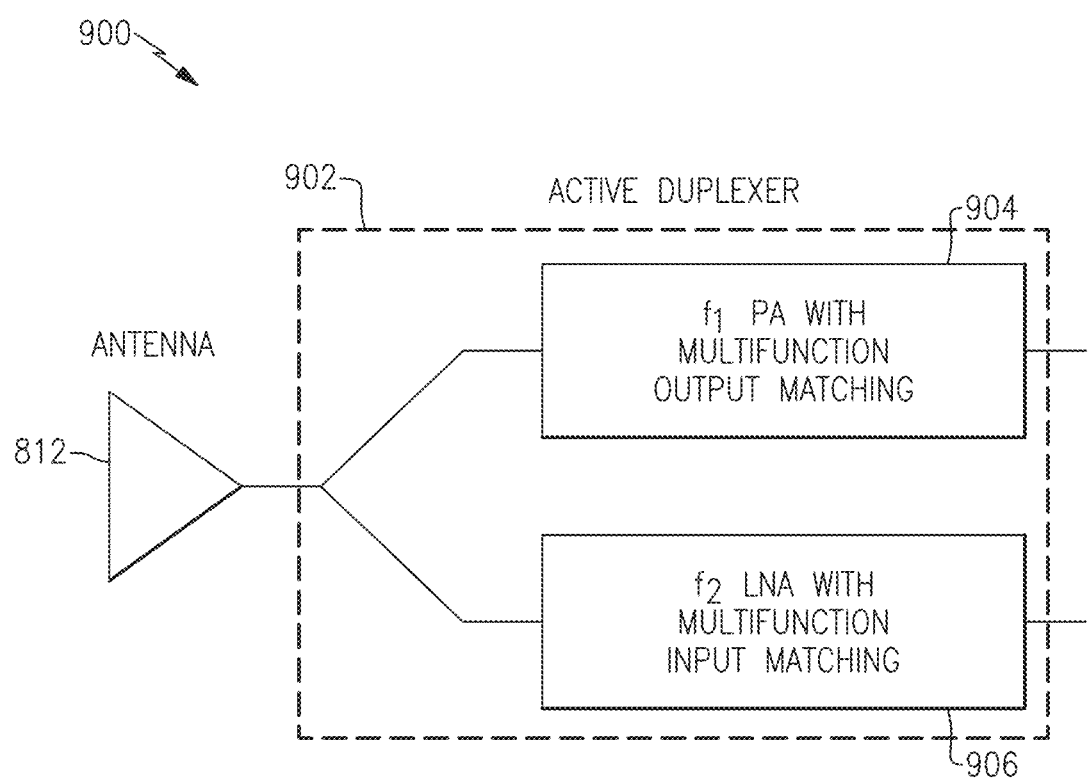
FIG. 9 is a block diagram of an example of an active duplexer in accordance with certain aspects of the present disclosure.

FIG. 9 is a block diagram of an example of a portion of a wireless device 900 that includes an active duplexer 902 in accordance with certain aspects of the present disclosure. The active duplexer 902 may direct signals to or from a signal or communication path. For example, the active duplexer 902 may direct signals for transmission to the antenna 812. Similarly, the active duplexer 902 may direct received signals that are received from the antenna 812 to a signal path within the wireless device 900 (e.g., to a front-end module or transceiver, or components thereof).

The active duplexer 902 includes a power amplifier 904 configured to amplify or process signals for transmission associated with a first frequency, or frequency band, $f_1$. Further, the active duplexer 902 includes a low noise amplifier 906 configured to amplify or process received signals that are received by the antenna 812 and that are associated with a second frequency or frequency band, $f_2$. As is described in more detail below, the power amplifier 904 and the low noise amplifier 906 may each include one or more input/output matching circuits. As least one of the matching circuits may be implemented using metamaterials.

The use of metamaterials enables the matching circuits to permit certain frequencies while blocking or preventing other frequencies from being transmitted along a signal path. Thus, for example, the metamaterial-based matching circuit of the power amplifier 904 may permit the transmission of signals having the frequency (or being within the frequency band) $f_1$ while blocking or preventing transmission of signals having the frequency (or being within the frequency band) $f_2$. Continuing this example, the metamaterial-based matching circuit of the low noise amplifier 906 may permit receipt of signals having the frequency (or being within the frequency band) $f_2$ while blocking or preventing receipt of signals having the frequency (or being within the frequency band) $f_1$. Thus, the combination of the power amplifier 904 incorporating the metamaterial matching circuit and the low noise amplifier 906 incorporating the metamaterial matching circuit may provide the functionality of a duplexer (e.g., the passive duplexer 814) without the inclusion of the circuitry of the passive duplexer 814. Accordingly, certain aspects of the present disclosure provide the functionality of a duplexer while preventing or reducing loss attributed to the passive duplexer 814. Further, certain aspects of the present disclosure provide the functionality of a duplexer while reducing the size and/or cost of the front-end module and/or transceiver attributed to the inclusion of a passive duplexer 814.

Figure 10:
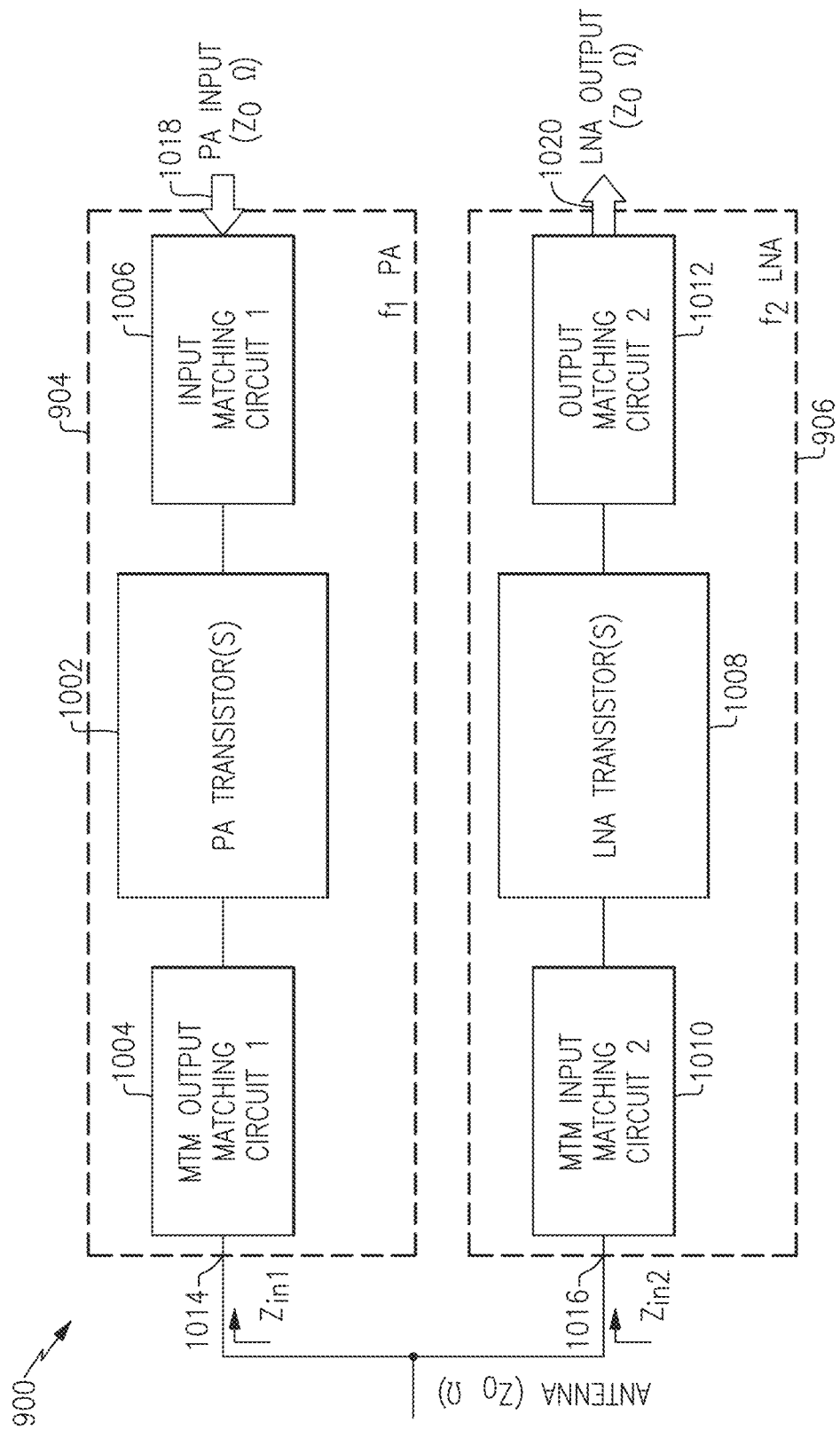
FIG. 10 is a more detailed block diagram of the example of the active duplexer of FIG. 9 in accordance with certain aspects of the present disclosure.

FIG. 10 is a more detailed block diagram of the example of the active duplexer 900 of FIG. 9 in accordance with certain aspects of the present disclosure. As previously described, the power amplifier 904 may be configured to amplify signals of a frequency, or within a frequency band, $f_1$. The power amplifier 904 may include amplifier circuitry 1002. This amplifier circuitry 1002 may include one or more transistors configured to amplify a signal. Further, in some implementations, the amplifier circuitry 1002 may include a direct current biasing network for biasing the power amplifier, or one or more of the transistors of the power amplifier 904. The one or more transistors may be field-effect transistors (FETs). Alternatively, the one or more transistors may include any other type of transistor that may be used to form a power amplifier, such as bipolar junction transistors.

In addition, the power amplifier 904 includes a metamaterial output matching circuit 1004 and an input matching circuit 1006. The input matching circuit 1006 may be configured to match an impedance of the power amplifier 904 with an impedance of a circuit element connected to the power amplifier 904 at the input of the power amplifier 904 (e.g., port 1018). Further, the input matching circuit 1006 can include any type of non-metamaterial matching circuit. For example, the input matching circuit 1006 may include a switch-capacitor based matching circuit, an inductor-capacitor (LC) matching circuit, or any other type of matching circuit. Further, in some cases, the input matching circuit 1006 may be replaced with a metamaterial matching circuit.

The metamaterial output matching circuit 1004 may be configured to match an impedance of the power amplifier 904 to an impedance of the antenna 812 (not shown) or to an impedance at the port 1014, which may be connected via a signal path to the antenna 812. The metamaterial output matching circuit 1004 may be configured to match the impedance at a particular frequency, or frequency band, $f_1$ corresponding to the frequency, or frequency band, that the power amplifier 904 is configured to amplify or process. However, the metamaterial output matching circuit 1004 may be configured to have an impedance mismatch with the impedance at the port 1014 for frequencies that differ from the frequency or frequency band $f_1$. In particular, the metamaterial output matching circuit 1004 may be configured to have an impedance mismatch with the impedance at the port 1014 when the frequency of a signal received at the antenna 812 is $f_2$, or is within the frequency band associated with $f_2$.

When the impedance at the port 1014 matches the impedance of the metamaterial output matching circuit 1004, a signal may flow through the signal path that connects the power amplifier 904 to the antenna 812. When there is an impedance mismatch between the port 1014 and the metamaterial output matching circuit 1004, the communication of a signal through the signal path that connects the power amplifier 904 to the antenna 812 may be reduced or prevented depending on the level or amount of mismatch of the impedance. Thus, as the impedance of the metamaterial output matching circuit 1004 moves towards ∞, or as the mismatch between the impedance of the transmission line at the port 1014 and the metamaterial output matching circuit 1004 grows, the signal is reduced and/or blocked from the power amplifier 904. Accordingly, the metamaterial output matching circuit 1004 may enable the flow of a signal with the frequency $f_1$ and block a signal with the frequency $f_2$.

The low noise amplifier circuit 906 may include similar elements and may be configured similarly to the power amplifier 904, but with respect to permitting signals of frequency $f_2$ and blocking signals of frequency $f_1$. The low noise amplifier circuit 906 may be configured to amplify signals of a frequency, or within a frequency band, $f_2$. While typically the power amplifier 904 amplifies signals for transmission, the low noise amplifier 906 may amplify a received signal to facilitate processing by a transceiver or other elements within a receive signal path. The low noise amplifier 906 may include amplifier circuitry 1008. This amplifier circuitry 1008 may include one or more transistors configured to amplify a signal. Further, the amplifier circuit 1008 may include a direct current biasing network for biasing one or more transistors of the low noise amplifier. The one or more transistors may be field-effect transistors (FETs). Alternatively, the one or more transistors may include any other type of transistor that may be used to form a low noise amplifier, such as bipolar junction transistors.

In addition, the low noise amplifier 906 includes a metamaterial input matching circuit 1010 and an output matching circuit 1012. The output matching circuit 1012 may be configured to match an impedance of the low noise amplifier 906 with an impedance of a circuit element connected to the low noise amplifier 906 at the output of the low noise amplifier 906 (e.g., port 1020). Further, the output matching circuit 1012 can include any type of non-metamaterial matching circuit. For example, the output matching circuit 1012 may include a switch-capacitor based matching circuit, an inductor-capacitor (LC) matching circuit, or any other type of matching circuit. Further, in some cases, the output matching circuit 1012 may be replaced with a metamaterial matching circuit. In some cases, the output matching circuit 1012 and the input matching circuit 1006 may be of the same type or configuration.

The metamaterial input matching circuit 1010 may be configured to match an impedance of the low noise amplifier 906 to an impedance of the antenna 812 (not shown) or to an impedance at the port 1016, which may be connected via a signal path to the antenna 812. The metamaterial input matching circuit 1010 may be configured to match the impedance at a particular frequency, or frequency band, $f_2$ corresponding to the frequency, or frequency band, that the low noise amplifier 906 is configured to amplify or process. However, the metamaterial input matching circuit 1010 may be configured to have an impedance mismatch with the impedance at the port 1016 for frequencies that differ from the frequency or frequency band $f_2$. In particular, the metamaterial input matching circuit 1010 may be configured to have an impedance mismatch with the impedance at the port 1016 when the frequency of a signal received at the antenna 812 is $f_1$, or is within the frequency band associated with $f_1$.

When the impedance at the port 1016 matches the impedance of the metamaterial input matching circuit 1010, a signal may flow through the signal path that connects the low noise amplifier 906 to the antenna 812. When there is an impedance mismatch between the port 1016 and the metamaterial input matching circuit 1010, the communication of a signal through the signal path that connects the low noise amplifier 906 to the antenna 812 may be reduced or prevented depending on the level or amount of mismatch of the impedance. Thus, as the impedance of the metamaterial input matching circuit 1010 moves towards ∞, or as the mismatch between the impedance of the transmission line at the port 1016 and the metamaterial input matching circuit 1010 grows, the signal is reduced and/or blocked from the low noise amplifier 906. Accordingly, the metamaterial input matching circuit 1010 may enable the flow of a signal with the frequency $f_2$ and block a signal with the frequency $f_1$.

As the metamaterial output matching circuit 1004 permits the flow of signals with a frequency $f_1$ while blocking signals with a frequency $f_2$, and as the metamaterial input matching circuit 1010 permits the flow of signals with a frequency $f_2$ while blocking signals with a frequency $f_1$, the combination of the circuits 904 and 906 provide the functionality of a duplexer without including the circuitry of a duplexer, thereby reducing space and cost compared to systems that incorporate a passive duplexer. The metamaterial output matching circuit 1004 and the metamaterial input matching circuit 1010 may include any type of metamaterial circuit. A metamaterial circuit can generally include any circuit made from an electromagnetic metamaterial. A metamaterial may generally include a deliberately engineered artificial effectively homogenous electromagnetic structure that is not found in nature. These metamaterials may include unusual properties not found in natural materials. For example, metamaterials may include negative permittivity and negative permeability. The negative permittivity and negative permeability of some metamaterials may result in the occurrence of one or more unusual phenomena not typically found in other materials. For example, the negative permittivity and negative permeability of some metamaterials may cause the occurrence of negative phase velocity, negative refraction, or a reversal of the Doppler Effect, among other phenomena.

Figure 17A:
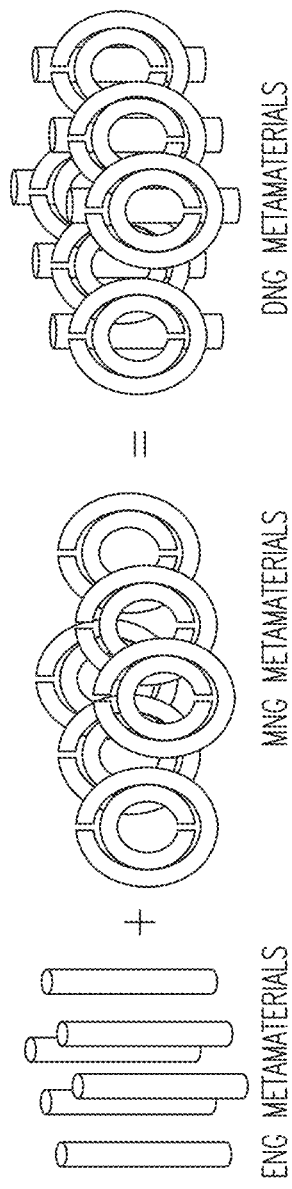
FIG. 17A illustrates creation of a double-negative (DNG) metamaterial in accordance with certain aspects of the present disclosure.
Figure 17C:
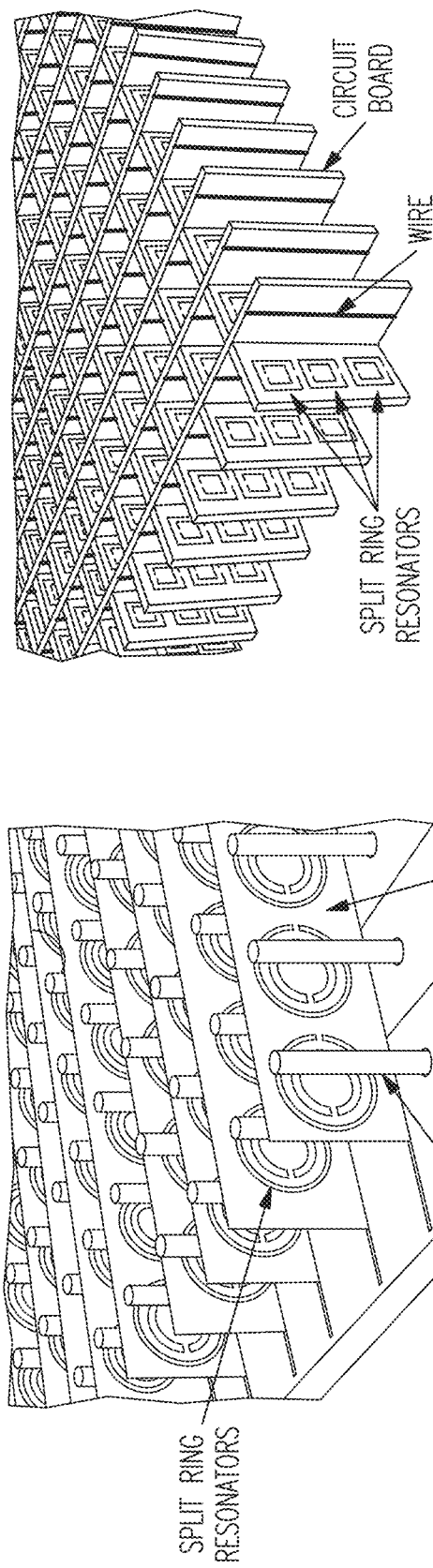
FIG. 17C illustrates another example implementation of the DNG metamaterial of FIG. 17A.
Figure 17B:
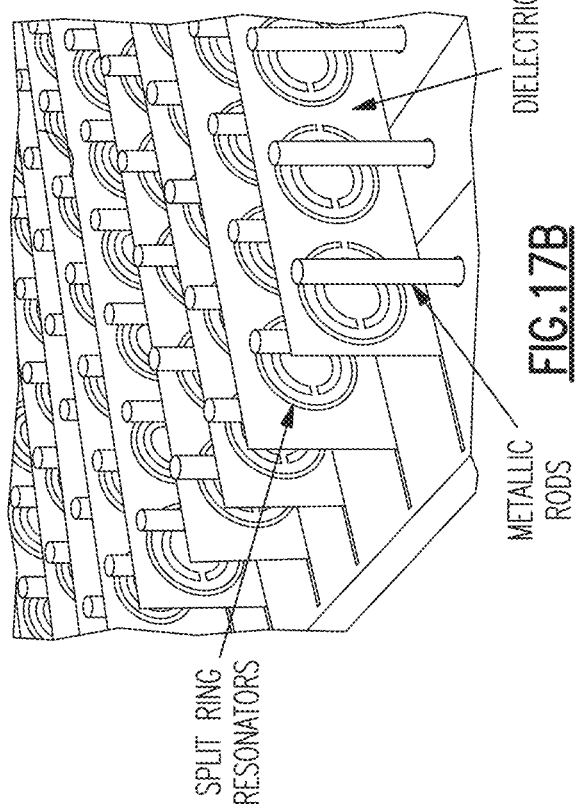
FIG. 17B illustrates one example implementation of the DNG metamaterial of FIG. 17A.

Typically, the homogenous structure of the metamaterial includes an average cell size that is smaller than a wavelength of a target signal (e.g., with a smaller wavelength than signals of a frequency $f_1$ or $f_2$ processed by the power amplifier 904 or the low noise amplifier 906). The material or structure of the metamaterial is typically arranged in a repeating pattern. Further, the metamaterial may be formed from an arrangement of metal structures on a surface of a dielectric substrate. FIGS. 17A-17C illustrate some non-limiting examples of metamaterial structures. As illustrated in FIG. 17A, a double-negative (DNG) metamaterial may be formed by combining metallic rods of a thin wire-based epsilon negative (ENG) structure with split ring resonators of a mu-negative (MNG) metamaterial. FIG. 17B illustrates one example implementation of the DNG metamaterial of FIG. 17A with planar split ring resonators etched on a thin dielectric layer positioned behind metallic rods. FIG. 17C illustrates another example implementation of the DNG metamaterial of FIG. 17A with split ring resonators etched on one side of the dielectric layer and with planar strips etched on the other side of the dielectric layer.

In some cases, any semiconductor material used for creating a circuit may be used to create a metamaterial. For example, the metamaterial may be formed or created from gallium arsenide or silicon. In some cases, the metamaterial circuit may be formed as a transmission line or as a lumped element of a transmission line. Advantageously, the metamaterial transmission line may have multiband characteristics. In contrast, an LC circuit used for matching typically only has single band characteristics and not multiband characteristics. Thus, the use of metamaterial designs for the transmission lines may provide support for multiband communication using the active duplexer 900.

Figure 11:
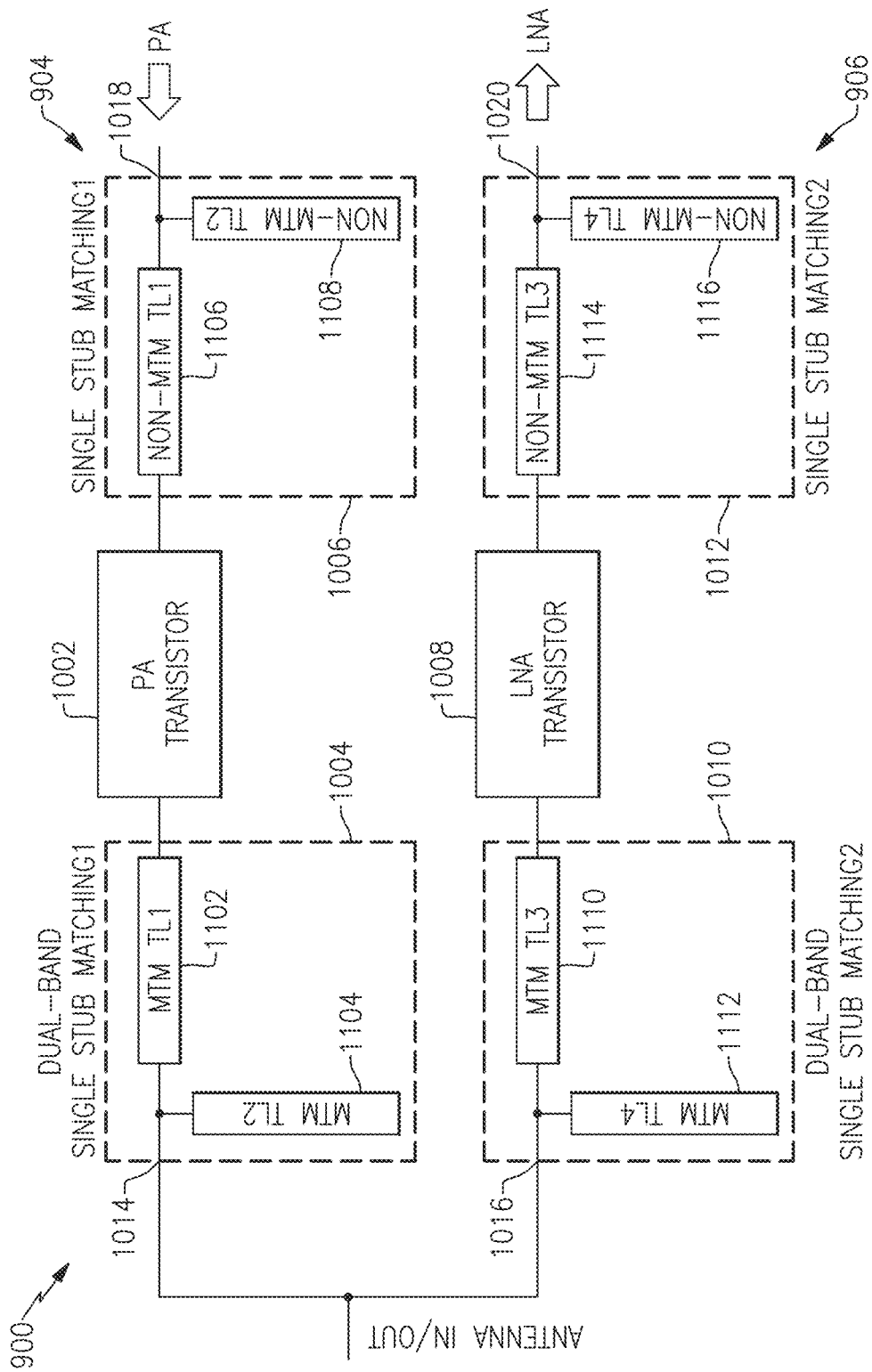
FIG. 11 is a block diagram of a transmission-line based example of the active duplexer of FIG. 9 in accordance with certain aspects of the present disclosure.

FIG. 11 is a block diagram of a transmission-line based example of the active duplexer 900 of FIG. 9 in accordance with certain aspects of the present disclosure. As previously described, the metamaterial output matching circuit 1004 and the metamaterial input matching circuit 1010 may be formed from a metamaterial transmission line. In some implementations, the metamaterial output matching circuit 1004 may be formed from a pair of metamaterial transmission lines 1102, 1104. The metamaterial transmission line 1104 may be connected as a stub with one end of the metamaterial transmission line 1104 connected between the metamaterial transmission line 1102 and an output port 1014 of the power amplifier 904. The metamaterial transmission line 1102 may be connected between one or more transistors of the amplifier circuity 1002 and the output port 1014. Some example implementations of the metamaterial transmission lines 1102, 1104 are described below with respect to FIG. 12. The metamaterial output matching circuit 1004 may be a dual-band matching circuit designed to provide different impedance matching values for two different frequency bands. As previously described, the metamaterial output matching circuit 1004 may be designed to permit the flow or transmission of signals of a first frequency band $f_1$ while preventing the flow or transmission of signals of a second frequency band $f_2$ along a signal path that includes the power amplifier 904.

The non-metamaterial input matching circuit 1006 may be formed from a similar construction of transmission lines as the metamaterial output matching circuit 1004. However, unlike the metamaterial output matching circuit 1004, the transmission lines 1106, 1108 of the input matching circuit 1006 may be non-metamaterial based transmission lines. In certain implementations, the input matching circuit 1006 may be formed by a first non-metamaterial transmission line 1106 connected between one or more transistors of the amplifier circuitry 1002 and the input port 1018 of the power amplifier 904. Further, the input matching circuit 1006 may include a second non-metamaterial transmission line 1108 connected as a stub with one end connected between the non-metamaterial transmission line 1106 and the input port 1018 of the power amplifier 904.

Similar to the metamaterial output matching circuit 1004, the metamaterial input matching circuit 1010 may be formed from a pair of metamaterial transmission lines 1110, 1112 connected between the amplifier circuitry 1008 of the low noise amplifier 906 and the input port 1016 of the low noise amplifier 906. The metamaterial transmission line 1112 may be connected as a stub with one end of the metamaterial transmission line 1112 connected between the metamaterial transmission line 1110 and an input port 1016 of the low noise amplifier 906. The metamaterial transmission line 1110 may be connected between one or more transistors of the amplifier circuity 1008 and the input port 1016. Some example implementations of the metamaterial transmission lines 1110, 1112 are described below with respect to FIG. 12. The metamaterial input matching circuit 1010 may be a dual-band matching circuit designed to provide different impedance matching values for two different frequency bands. As previously described, the metamaterial input matching circuit 1010 may be designed to prevent the flow or transmission of signals of a first frequency band $f_1$ while permitting the flow or transmission of signals of a second frequency band $f_2$ along a signal path that includes the low noise amplifier 906.

The non-metamaterial output matching circuit 1012 may be formed from a similar construction of transmission lines as the metamaterial input matching circuit 1010. However, unlike the metamaterial input matching circuit 1010, the transmission lines 1114, 1118 of the output matching circuit 1012 may be non-metamaterial based transmission lines. In certain implementations, the output matching circuit 1012 may be formed by a first non-metamaterial transmission line 1114 connected between one or more transistors of the amplifier circuitry 1008 and the output port 1020 of the low noise amplifier 906. Further, the output matching circuit 1012 may include a second non-metamaterial transmission line 1116 connected as a stub with one end connected between the non-metamaterial transmission line 1114 and the output port 1020 of the low noise amplifier 904. The single stub-matching circuits may be formed from a transmission line, or a trace, that lacks any lumped elements. In contrast, as illustrated below with respect to FIG. 12, the metamaterial transmission lines may include two or more LC circuits that can provide metamaterial characteristics.

Figure 12:
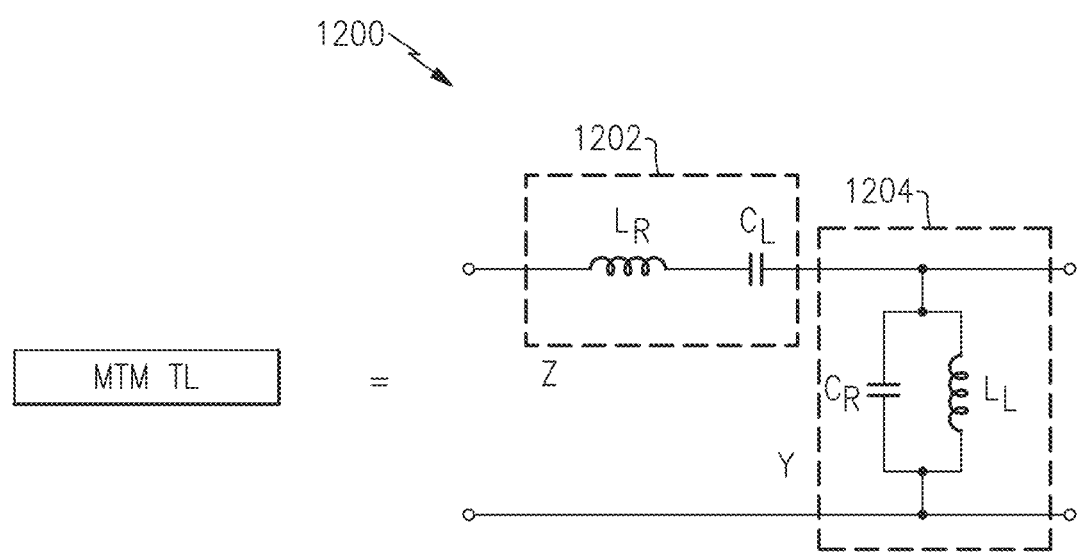
FIG. 12 is a circuit diagram of an example metamaterial transmission line included in certain aspects of the active duplexer of FIG. 11 in accordance with certain aspects of the present disclosure.

FIG. 12 is a circuit diagram of an example metamaterial transmission line 1200 included in certain aspects of the active duplexer 900 of FIG. 11 in accordance with certain aspects of the present disclosure. The example metamaterial transmission line 1200 may be used to implement any one or more of the metamaterial transmission lines 1102, 1104, 1110, 1112.

The metamaterial transmission line 1200 may be a lumped element transmission line formed from a pair of Inductor-Capacitor (LC) circuits 1202, 1204. In some embodiments, the metamaterial transmission line 1200 may be formed from a combination of transmission lines (or conductive lines) and lumped elements (e.g., LC circuits) within one or more portions of the transmission line. Alternatively, in some embodiments the metamaterial transmission line 1200 may be formed from just lumped elements. Whether the metamaterial transmission line 1200 is formed from a combination of transmission lines and lumped elements, or from just lumped elements may depend on the particular application for the circuit.

The LC circuit 1202 may include a right-handed inductor in series with a left-handed capacitor. Further, the LC circuit 1204 may include a right-handed capacitor connected in parallel with a left-handed inductor. The LC circuits 1202 and 1204 may be lumped element circuits that may be configured to provide metamaterial characteristics. In other words, in some embodiments, the lumped element LC circuits 1202 and 1204 may be configured to provide negative permittivity and negative permeability. While a conventional transmission line may provide matching, the metamaterial transmission line formed from the LC circuits 1202 and 1204 may provide a multifunctional structure that includes provide both matching and isolation characteristics. These isolation characteristics may be improved over the non-metamaterial transmission line structures. These isolation characteristics may provide isolation from the second communication line. In other words, isolation between the signal path with the power amplifier 904 and the signal path with the low noise amplifier 906 can be achieved without the addition of a separate duplexer (e.g., a passive duplexer).

Figure 18A:
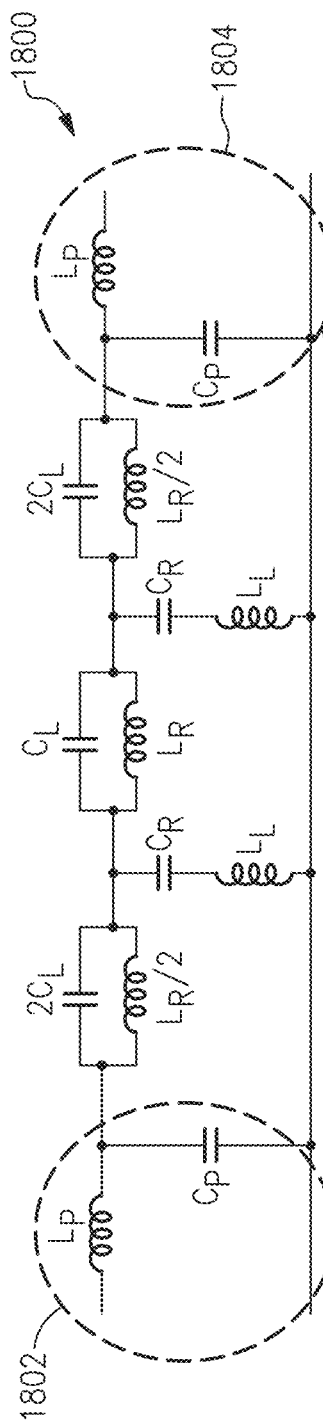
FIG. 18A illustrated a circuit diagram of a double-Lorentz (DL) metamaterial transmission line in accordance with certain embodiments.
Figure 18B:
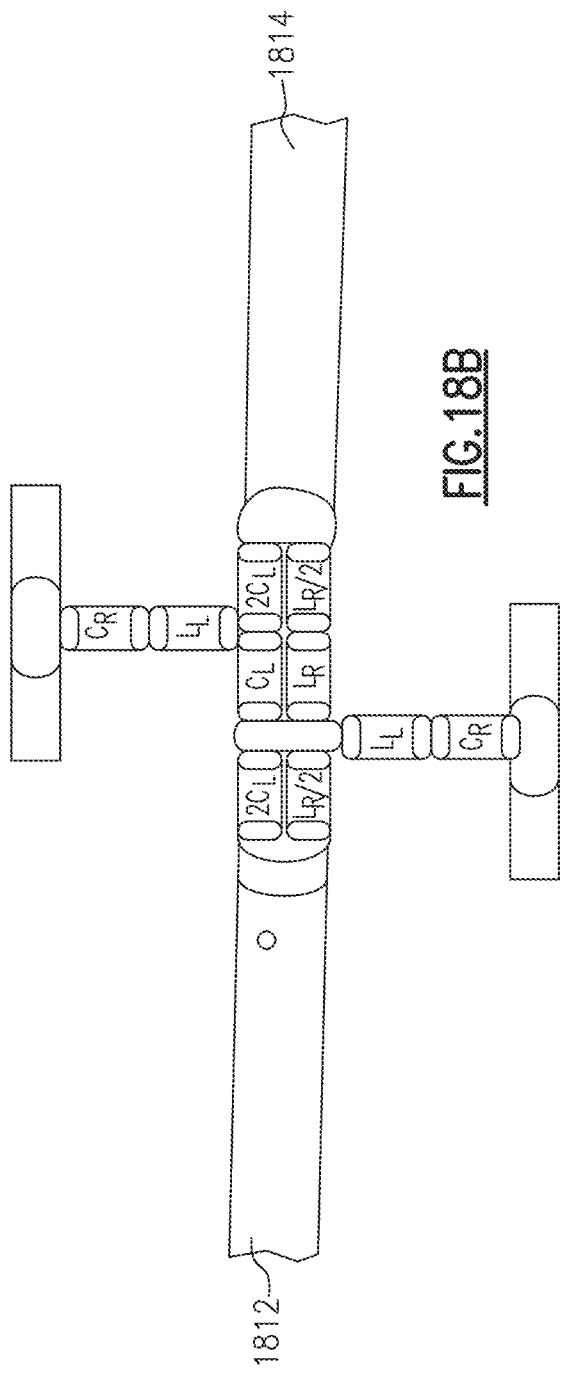
FIG. 18B illustrates an implementation of the circuit represented by the circuit diagram of FIG. 18A in accordance with certain embodiments.

FIGS. 18A and 18B illustrate another example of a metamaterial transmission line that can be used with respect to the embodiments disclosed herein. FIG. 18A illustrates a circuit diagram 1800 of a double-Lorentz (DL) metamaterial transmission line. FIG. 18B illustrates a line drawing reproduction of a photograph of an implementation of the circuit represented by the circuit diagram of FIG. 18A. The circled portions 1802 and 1804 of the circuit diagram 1800 are represented by microstrip transmission lines 1812 and 1814, respectively. The remaining LC circuits of the circuit diagram 1800 are represented by the lumped elements depicted in the example of FIG. 18B. The illustrated circuit 1800 may, in some embodiments, be used as an alternative to the metamaterial transmission line 1200. The specific values of the LC circuits and the specific configuration of the microstrip transmission lines 1812 and 1814 may be selected based on the desired signal frequencies to permit and the signal frequencies to block for the specific user case. When an undesired signal frequency is received, the selected LC circuits and the specific configuration of the microstrip transmission lines may provide infinite impedance. In certain embodiments, the specific configuration and values selected for the LC circuits of the circuit 1800, or the circuit 1200, may be selected to emulate properties or provide the properties of a metamaterial including the negative permittivity and negative permeability of the metamaterial. In other words, in some embodiments, the LC circuits may be designed to simulate metamaterials and/or the properties of metamaterials. By causing the LC circuits to emulate or provide the characteristics of the metamaterial, it is possible to cause the PA signal path to permit a first particular frequency or set of frequencies while blocking a second frequency or set of frequencies. Similarly, the LNA single path may be configured to block the first particular frequency or set of frequencies while permitting a second frequency or set of frequencies. Thus, the use of the metamaterial, or the transmission line and LC circuit combination configured to emulate a metamaterial enables the matching circuit to provide duplexer functionality without the addition of a separate passive duplexer. Further, the specific L and C values in the circuit 1200 illustrated in FIG. 12 may be selected or determined using the following equations:

$$L_R = \frac{Z_t[\phi_1(\omega_1/\omega_2) - \phi_2]}{N\omega_2[1 - (\omega_1/\omega_2)^2]} \quad (1)$$

$$C_R = \frac{\phi_1(\omega_1/\omega_2) - \phi_2}{\omega_2 Z_t[1 - (\omega_1/\omega_2)^2]} \quad (2)$$

$$L_L = \frac{NZ_t[1 - (\omega_1/\omega_2)^2]}{\omega_1[\phi_1(\omega_1/\omega_2) - \phi_2]} \quad (3)$$

$$C_L = \frac{N[1 - (\omega_1/\omega_2)^2]}{\omega_1 Z_t[\phi_1(\omega_1/\omega_2) - \phi_2]} \quad (4)$$

In the above equations, $\phi_1$ represents the phase shift at frequency $\omega_1$ and $\phi_2$ represents the phase shift at frequency $\omega_2$. Further, N represents the number of CRLH (composite right/left handed) cells with each CRLH cell being formed from the transmission line circuit 1200 illustrated in FIG. 12. And $Z_t$ represents the terminal impedance. The $L_R$, $C_R$, $L_L$, and $C_L$ represent the left-handed and right-handed inductors and capacitors of the CRLH cell illustrated in FIG. 12. Further, the Z and Y in FIG. 12 refers to the impedance and admittance values.

Active Duplexer Circuit Simulations

Figure 13:
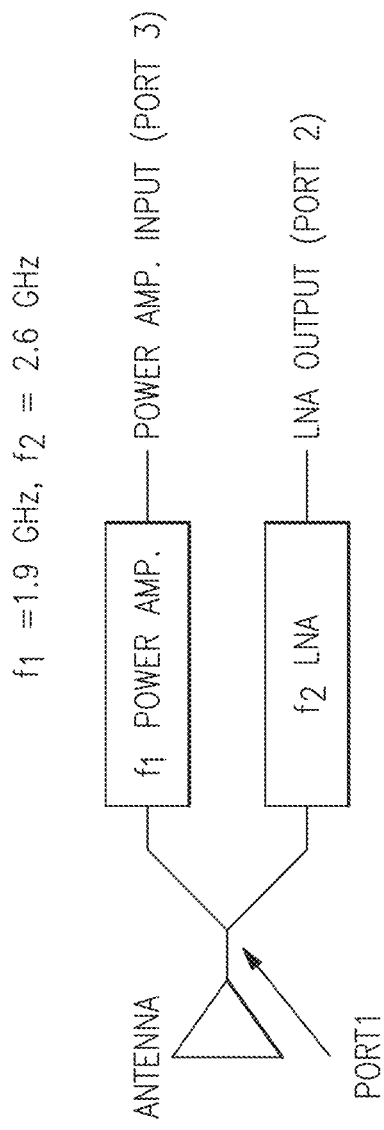
FIG. 13 presents simulation results for an example of the active duplexer.

FIG. 13 presents simulation results for an example of the active duplexer 900. For the simulation, the frequency $f_1$ supported by the power amplifier was set to 1.9 GHz and the frequency $f_2$ supported by the low noise amplifier was set to 2.6 GHz. Further, the power amplifier was set to provide a gain of more than 15 dB with a power added efficiency of more than 55%. The low noise amplifier was set to also provide a gain of more than 15 dB with a noise figure below 2.0. Both devices were configured with an input/output return loss of greater than 10 dB. During simulation, the leakage from the power amplifier input to the LNA output was less than −60 dB. Thus, the simulation shows that the configuration of the power amplifier and low noise amplifier using the aspects of the present disclosure enable the functionality of a duplexer. In other words, signal from the power amplifier is prevented from traversing a communication path including the low noise amplifier, and signal received at the antenna is prevented from traversing a communication path including the power amplifier.

As illustrated herein (e.g., in FIGS. 9, 10, 11, and 13), the LNA input and the PA output may both be physically connected to the antenna, but only one may be electrically connected. The active duplexer of the present disclosure prevents signal leakage between the transmit and the receive paths (e.g., between the PA and LNA paths, between the PA input and LNA output, and/or between the LNA input and the PA output). If the active duplexer was not functional, there would exist leakage between the ports 2 and 3 of FIG. 13. The use of the metamaterial provides isolation on both the input and output side of the active duplexer, or the front-end module that includes the active duplexer. This leakage can also occur due to proximity of the signal lines causing signal coupling. However, using the embodiments of the active duplexer of the present disclosure, the receive signal can be blocked on the transmit line and vice versa, and the leakage can be reduced or eliminated.

Figure 14:
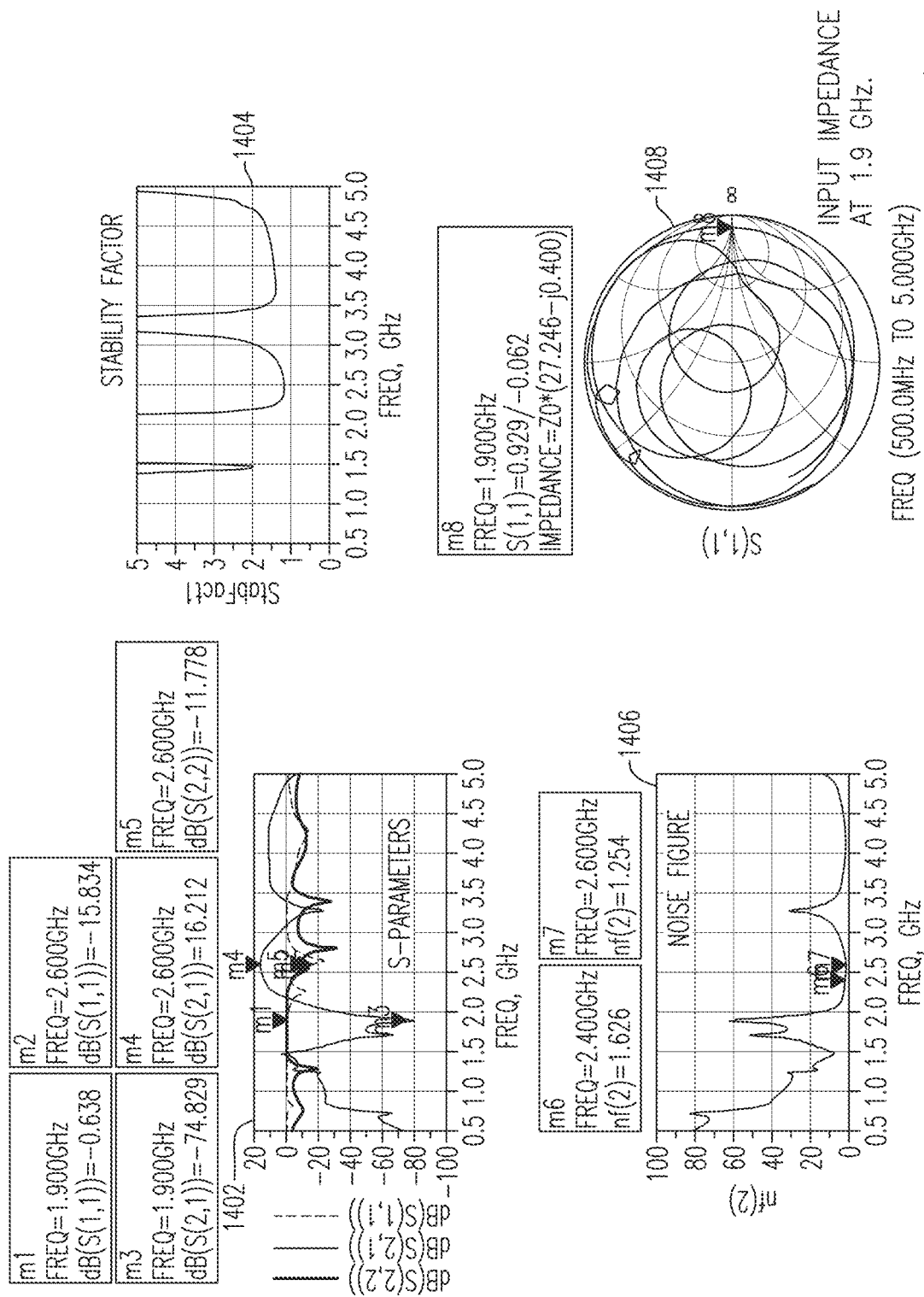
FIG. 14 presents graphs of simulation results for the low noise amplifier of the active duplexer simulated in FIG. 13.

FIG. 14 presents graphs of simulation results for the low noise amplifier of the active duplexer simulated in FIG. 13. As illustrated by the graph 1408, when the frequency of the signal received by the active duplexer is 1.9 GHz (the frequency supported by the power amplifier in the simulation), the input impedance approaches infinity for the low noise amplifier. Thus, a signal output by the power amplifier at around 1.9 GHz will be output by the antenna at port 1 of the active duplexer of FIG. 13, but will not be provided to the input of the low noise amplifier. Further, as indicated by the graph 1406, the noise figure around 2.6 GHz (the frequency supported by the low noise amplifier in the simulation) is close to 0 (1.254). Moreover, the graph 1402 indicates that at 2.6 GHz, the S21 transmission characteristic is around 16 dB and the graph 1404 indicates stability above 1 at 2.6 GHz indicating that the low noise amplifier is working and stable at the target frequency.

Figure 15:
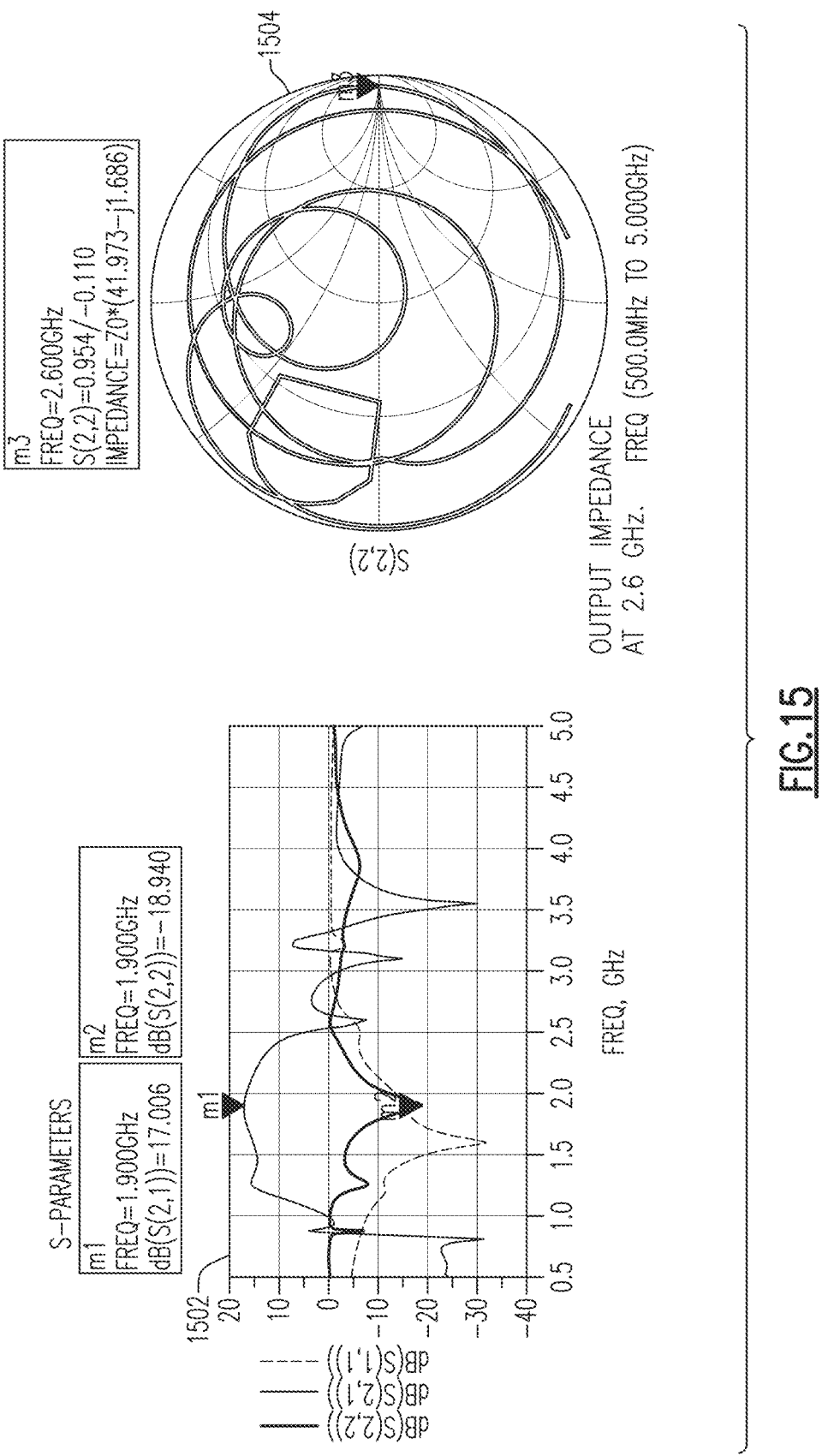
FIG. 15 presents graphs of simulation results for the power amplifier of the active duplexer simulated in FIG. 13.

FIG. 15 presents graphs of simulation results for the power amplifier of the active duplexer simulated in FIG. 13. Similar to the graph 1408, the graph 1504 indicates that when the frequency of the signal received by the active duplexer is 2.6 GHz (the frequency supported by the low noise amplifier in the simulation), the input impedance approaches infinity for the power amplifier. Thus, a signal received by the low noise amplifier at around 2.6 GHz will not travel the transmission or communication path that includes the power amplifier. Further, the graph 1502 indicates that at 1.9 GHz, the S21 transmission characteristic is around 17 dB indicating that the power amplifier is working at the target frequency.

Figure 16:
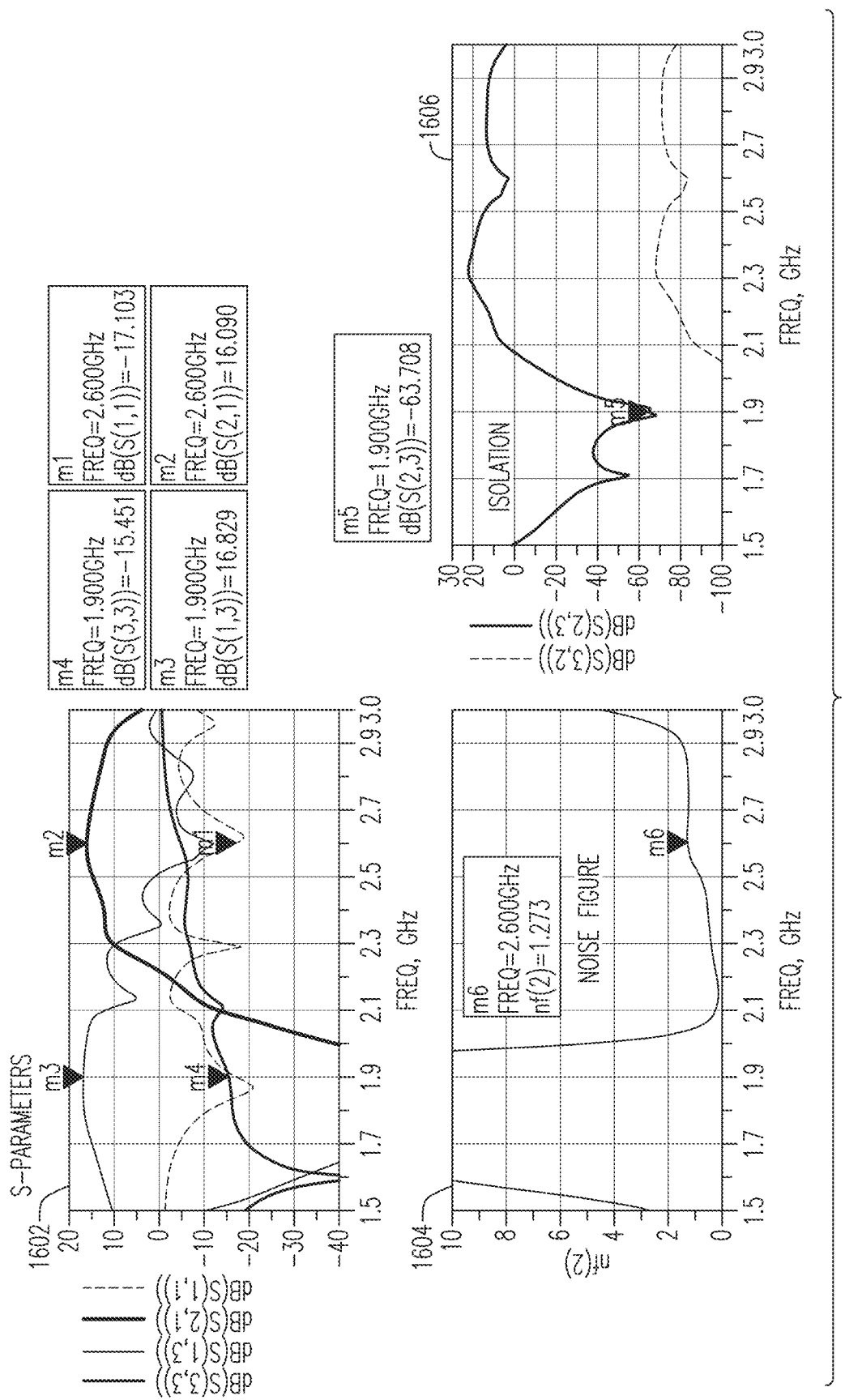
FIG. 16 presents graphs of simulation results for the active duplexer simulated in FIG. 13.

FIG. 16 presents graphs of simulation results for the active duplexer simulated in FIG. 13. Similar to the graphs presenting the simulations of the power amplifier and low noise amplifier, the graph 1602 indicates good transmission characteristics (e.g., above 16 dB) for the transmission paths of the power amplifier at 1.9 GHz and the low noise amplifier at 2.6 GHz. Further, the graph 1604 indicates that the low noise amplifier maintains its low noise figure (e.g., around 1.273) at 2.6 GHz when incorporated into the active duplexer with the power amplifier. Further, the graph 1606 indicates isolation between the power amplifier and low noise amplifier of −63 dB at the power amplifier supported frequency of 1.9 GHz. Accordingly, simulations of aspects of the active duplexer presented herein indicated that the passive duplexer can be replaced in a front-end module and/or transceiver by using metamaterials for the impedance matching circuits of the PA and LNA. Thus, the size of the front-end module and/or transceiver can be reduced while insertion loss can be reduced by replacing the passive duplexer with an active duplexer.

Terminology

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 450 MHz to 8.5 GHz. Acoustic wave filters disclosed herein can filter RF signals at frequencies up to and including millimeter wave frequencies.

Aspects of this disclosure can be implemented in various electronic devices. Examples of the electronic devices can include, but are not limited to, consumer electronic products, parts of the consumer electronic products such as packaged radio frequency modules, radio frequency filter die, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators, filters, multiplexer, devices, modules, wireless communication devices, apparatus, methods, and systems described herein may be embodied in a variety of other forms. Furthermore, various omissions, substitutions and changes in the form of the resonators, filters, multiplexer, devices, modules, wireless communication devices, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. An active duplexer comprising:
a power amplifier circuit configured to amplify signals of a first frequency, the amplified signals outputted to an antenna, the power amplifier circuit including a first transistor electrically connected to a metamaterial output matching circuit, and a non-metamaterial input matching circuit in electrical communication with at least one transistor of the power amplifier circuit; and
a low noise amplifier circuit configured to amplify signals of a second frequency received from the antenna, the low noise amplifier circuit including a second transistor electrically connected to a metamaterial input matching circuit, and the power amplifier circuit and the low noise amplifier circuit operating as a duplexer.

2. The active duplexer of claim 1 wherein the antenna is electrically connected to the metamaterial output matching circuit and to the metamaterial input matching circuit.

3. An active duplexer comprising:
a power amplifier circuit configured to amplify signals of a first frequency, the amplified signals outputted to an antenna, the power amplifier circuit including a first transistor electrically connected to a metamaterial output matching circuit; and
a low noise amplifier circuit configured to amplify signals of a second frequency received from the antenna, the low noise amplifier circuit including a second transistor electrically connected to a metamaterial input matching circuit, and the power amplifier circuit and the low noise amplifier circuit operating as a duplexer, the antenna electrically connected to the metamaterial output matching circuit and to the metamaterial input matching circuit, and an impedance between the metamaterial output matching circuit and the antenna is at a first impedance value when the signals of the first frequency are received by the power amplifier circuit and at a second impedance value when the signals of the second frequency are received by the power amplifier circuit.

4. The active duplexer of claim 3 wherein the first impedance value permits the signals of the first frequency to be provided to the power amplifier circuit and the second impedance value blocks the signals of the second frequency from being provided to the power amplifier circuit.

5. The active duplexer of claim 3 wherein an impedance between the metamaterial input matching circuit and the antenna is at the second impedance value when the signals of the first frequency are received by the low noise amplifier circuit and at the first impedance value when the signals of the second frequency are received by the low noise amplifier circuit.

6. The active duplexer of claim 5 wherein the first impedance value permits the signals of the second frequency to be provided to the low noise amplifier circuit and the second impedance value blocks the signals of the first frequency from being provided to the low noise amplifier circuit.

7. The active duplexer of claim 1 wherein the power amplifier circuit is configured to amplify a first frequency band that includes the first frequency, and the low noise amplifier circuit is configured to amplify a second frequency band that includes the second frequency.

8. An active duplexer comprising:
a power amplifier circuit configured to amplify signals of a first frequency, the amplified signals outputted to an antenna, the power amplifier circuit including a first transistor electrically connected to a metamaterial output matching circuit; and
a low noise amplifier circuit configured to amplify signals of a second frequency received from the antenna, the low noise amplifier circuit including a second transistor electrically connected to a metamaterial input matching circuit, and the power amplifier circuit and the low noise amplifier circuit operating as a duplexer, the low noise amplifier circuit further including a non-metamaterial output matching circuit in electrical communication with at least one transistor of the low noise amplifier circuit.

9. The active duplexer of claim 8 wherein the power amplifier circuit further includes a non-metamaterial input matching circuit in electrical communication with at least one transistor of the power amplifier circuit.

10. The active duplexer of claim 1 wherein the metamaterial output matching circuit includes at least one of a material with periodic structure, a lumped element circuit, a metamaterial transmission line, or a dual-band single stub matching circuit.

11. The active duplexer of claim 1 wherein the metamaterial input matching circuit includes at least one of a material with periodic structure, a lumped element circuit, a metamaterial transmission line, or a dual-band single stub matching circuit.

12. A front-end module comprising:
an active duplexer including a power amplifier circuit and a low noise amplifier circuit, the power amplifier circuit configured to amplify signals of a first frequency, the amplified signals outputted to an antenna, and the power amplifier circuit including a first transistor electrically connected to a metamaterial output matching circuit; and the low noise amplifier circuit configured to amplify signals of a second frequency received from the antenna, the low noise amplifier circuit including a second transistor electrically connected to a metamaterial input matching circuit, and the power amplifier circuit and the low noise amplifier circuit operating as a duplexer, the power amplifier circuit further including a non-metamaterial input matching circuit in electrical communication with at least one transistor of the power amplifier circuit, and the low noise amplifier circuit further including a non-metamaterial output matching circuit in electrical communication with at least one transistor of the low noise amplifier circuit; and
a switching circuit configured to switch between the power amplifier circuit and the low noise amplifier circuit.

13. The front-end module of claim 12 wherein the antenna is electrically connected to the metamaterial output matching circuit and to the metamaterial input matching circuit.

14. A front-end module comprising:
an active duplexer including a power amplifier circuit and a low noise amplifier circuit, the power amplifier circuit configured to amplify signals of a first frequency, the amplified signals outputted to an antenna, and the power amplifier circuit including a first transistor electrically connected to a metamaterial output matching circuit; and the low noise amplifier circuit configured to amplify signals of a second frequency received from the antenna, the low noise amplifier circuit including a second transistor electrically connected to a metamaterial input matching circuit, and the power amplifier circuit and the low noise amplifier circuit operating as a duplexer, the antenna electrically connected to the metamaterial output matching circuit and to the metamaterial input matching circuit, and an impedance between the metamaterial output matching circuit and the antenna is at a first impedance value when the signals of the first frequency are received by the power amplifier circuit and at a second impedance value when the signals of the second frequency are received by the power amplifier circuit; and
a switching circuit configured to switch between the power amplifier circuit and the low noise amplifier circuit.

15. The front-end module of claim 14 wherein the first impedance value permits the signals of the first frequency to be provided to the power amplifier circuit and the second impedance value blocks the signals of the second frequency from being provided to the power amplifier circuit.

16. The front-end module of claim 14 wherein an impedance between the metamaterial input matching circuit and the antenna is at the second impedance value when the signals of the first frequency are received by the low noise amplifier circuit and at the first impedance value when the signals of the second frequency are received by the low noise amplifier circuit.

17. The front-end module of claim 16 wherein the first impedance value permits the signals of the second frequency to be provided to the low noise amplifier circuit and the second impedance value blocks the signals of the first frequency from being provided to the low noise amplifier circuit.

18. The front-end module of claim 14 wherein:
the power amplifier circuit further includes a non-metamaterial input matching circuit in electrical communication with at least one transistor of the power amplifier circuit; and
the low noise amplifier circuit further includes a non-metamaterial output matching circuit in electrical communication with at least one transistor of the low noise amplifier circuit.

19. The front-end module of claim 12 wherein at least one of the metamaterial output matching circuit or the metamaterial input matching circuit includes at least one of a material with periodic structure, a lumped element circuit, a metamaterial transmission line, or a dual-band single stub matching circuit.

20. A wireless device comprising:
an antenna configured to receive or transmit signals of different frequencies; and
an active duplexer including a power amplifier circuit and a low noise amplifier circuit, the power amplifier circuit configured to amplify signals of a first frequency, the amplified signals outputted to the antenna, and the power amplifier circuit including a first transistor electrically connected to a metamaterial output matching circuit and a non-metamaterial input matching circuit in electrical communication with at least one transistor of the power amplifier circuit; and the low noise amplifier circuit configured to amplify signals of a second frequency received from the antenna, the low noise amplifier circuit including a second transistor electrically connected to a metamaterial input matching circuit, and the power amplifier circuit and the low noise amplifier circuit operating as a duplexer.

* * * * *